(12) United States Patent
Fukushima et al.

(10) Patent No.: US 8,778,802 B2
(45) Date of Patent: Jul. 15, 2014

(54) POLISHING METHOD AND METHOD FOR FABRICATING SEMICONDUCTOR DEVICE

(75) Inventors: Dai Fukushima, Kanagawa (JP); Gaku Minamihaba, Kanagawa (JP); Hiroyuki Yano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 711 days.

(21) Appl. No.: 11/802,532

(22) Filed: May 23, 2007

(65) Prior Publication Data

US 2007/0293047 A1   Dec. 20, 2007

(30) Foreign Application Priority Data

May 23, 2006  (JP) .................................. 2006-142585

(51) Int. Cl.
| | | |
|---|---|---|
| *C03C 15/00* | (2006.01) | |
| *C03C 25/68* | (2006.01) | |
| *H01L 21/302* | (2006.01) | |
| *H01L 21/461* | (2006.01) | |

(52) U.S. Cl.
USPC ................. 438/692; 216/83; 216/88; 216/92; 438/689; 438/690; 438/691; 438/745; 438/748; 438/749; 438/750; 438/754

(58) Field of Classification Search
USPC .......................................................... 216/89
See application file for complete search history.

(56) References Cited

U.S. PATENT DOCUMENTS

| | | | |
|---|---|---|---|
| 6,232,228 B1 * | 5/2001 | Kwag et al. .................... 438/669 |
| 6,315,643 B1 * | 11/2001 | Hiyama et al. .................. 451/60 |
| 6,705,929 B1 * | 3/2004 | Nishimoto et al. ............. 451/72 |
| 6,887,132 B2 * | 5/2005 | Kajiwara et al. ................ 451/41 |
| 2002/0028581 A1 * | 3/2002 | Yasui et al. .................... 438/689 |
| 2003/0013310 A1 * | 1/2003 | Tomimori et al. ............. 438/703 |
| 2005/0118937 A1 | 6/2005 | Fukushima et al. |
| 2005/0205207 A1 * | 9/2005 | Minamihaba et al. ... 156/345.12 |
| 2006/0105678 A1 | 5/2006 | Kohama et al. |

FOREIGN PATENT DOCUMENTS

| | | |
|---|---|---|
| JP | 09-057608 | 3/1997 |
| JP | 10-034535 | 2/1998 |
| JP | 2000-280165 | 10/2000 |
| JP | 2003-142436 | 5/2003 |
| JP | 2005-123232 | 5/2005 |

OTHER PUBLICATIONS

Notification of Examination Opinion issued by the Taiwan Intellectual Property Office on Nov. 8, 2010, for Taiwanese Patent Application No. 09920800740, and English-language translation thereof.

Official Communication from the Japanese Patent Office dated Apr. 19, 2011, for Japanese Patent Application No. 2006-142585 (4 pages).

Official Communication from the Japanese Patent Office dated Aug. 2, 2011, for Japanese Patent Application No. 2006-142585 (2 pages).

* cited by examiner

*Primary Examiner* — Nadine Norton
*Assistant Examiner* — Stephanie Duclair
(74) *Attorney, Agent, or Firm* — Finnegan, Henderson, Farabow, Garrett & Dunner, L.L.P.

(57) ABSTRACT

A polishing method includes causing a polishing pad arranged on a turn table to rotate together with the turn table, and polishing a surface of a substrate by using the rotating polishing pad while supplying a chemical fluid to a surface of the polishing pad on a fore side of the substrate from an oblique direction with respect to the surface of the polishing pad.

17 Claims, 12 Drawing Sheets

POLISHING METHOD AND METHOD FOR FABRICATING SEMICONDUCTOR DEVICE

CROSS-REFERENCE TO RELATED APPLICATION

This application is based upon and claims the benefit of priority from prior Japanese Patent Application No. 2006-142585 filed on May 23, 2006 in Japan, the entire contents of which are incorporated herein by reference.

BACKGROUND OF THE INVENTION

1. Field of the Invention

The present invention relates to a polishing method and a method for fabricating a semiconductor device and, for example, relates to a polishing method of polishing a copper (Cu) film and a method for fabricating a semiconductor device, having such a polishing step.

2. Related Art

With increasing integration and higher performance of semiconductor integrated circuits (LSI) in recent years, new micro processing technologies have been developed. Particularly, there have been moves recently to change a wiring material from conventional aluminum (Al) alloys to copper (Cu) or Cu allows (hereinafter called Cu together) having lower resistance to make LSI operate faster. It is difficult to apply a dry etching method, which is frequently used for forming Al alloy wires, to Cu for micro processing. For this reason, a damascene method is mainly adopted for Cu, in which a Cu film is deposited on a dielectric film to which groove machining has been provided and then the Cu film is removed except that in portions where embedded in a groove by chemical-mechanical polishing (CMP) to form embedded wiring. After forming a thin seed layer by a sputtering method or the like, the Cu film is generally formed into a laminated film having a thickness of several hundred nanometers by electrolytic plating. Further, when multi-layer Cu wiring is formed, particularly a method of forming wiring called a dual damascene structure can also be used. In this method, a dielectric film is deposited on lower layer wiring and predetermined via holes and trenches (wiring groove) for upper layer wiring are formed. Then, Cu to be a wiring material is embedded in the via holes and trenches simultaneously, and further unnecessary Cu in the upper layer is removed by CMP for flattening to form embedded wiring.

Recently, the use of a low dielectric constant material film with low relative dielectric constant (low-k film) has also been examined as an interlayer dielectric film. That is, an attempt has been made to reduce parasitic capacitance between wires by using a low-k film whose relative dielectric constant k is, for example, 3.5 or lower instead of a silicon oxide ($SiO_2$ film) whose relative dielectric constant k is about 4.2. Moreover, a barrier metal film of tantalum (Ta) or the like is generally formed between the Cu film and the low-k film to prevent diffusion of Cu to the low-k film. Then, unnecessary portions of such a barrier metal film are also removed by CMP for flattening. In addition, unnecessary portions of the $SiO_2$ film are removed by CMP for flattening.

The CMP method is, as described above, a technology widely used in high-performance LSI, memory and the like. Here, slurry, which acts as a polishing liquid, makes up a very large proportion among costs relating a CMP method, and thus there is a growing demand for reduction in flow rate of slurry. However, simply reducing the flow rate of slurry causes various problems such as a reduced polishing rate, increased dishing, and abnormal polishing due to a rise in polishing temperature. Then, also in a re-polishing for cleaning step performed after polishing in which, instead of slurry, a cleaning liquid is used, similarly the cleaning liquid costs very dearly. Also for the cleaning liquid, simply reducing the flow rate thereof causes not only reduced cleaning capabilities as process performance, but also various problems such as corrosion of metal portions. Thus, there has been a problem that the flow rate cannot be reduced, though reduction in flow rate of chemical fluids such as the polishing liquid and cleaning liquid has been desired.

A method of amassing slurry in a polishing pad has been disclosed as a technology to reduce the flow rate of slurry (see published Unexamined Japanese Patent Application Nos. 9-57608 and 2005-123232, for example). However, these technologies have a complicated mechanism, and it is currently very difficult to achieve a cost increase or cost reduction in additional equipment and process performance simultaneously.

BRIEF SUMMARY OF THE INVENTION

A polishing method according to an embodiment of the present invention includes:

causing a polishing pad arranged on a turn table to rotate together with the turn table; and polishing a surface of a substrate by using the rotating polishing pad while supplying a chemical fluid to a surface of the polishing pad on a fore side of the substrate from an oblique direction with respect to the surface of the polishing pad.

Also, a method for fabricating a semiconductor device according to another embodiment of the present invention includes:

forming a thin film on a surface of a substrate; and polishing the thin film by using a rotating polishing pad while supplying a chemical fluid to a surface of the polishing pad on a fore side of the substrate from an oblique direction with respect to the surface of the polishing pad.

DETAILED DESCRIPTION OF THE INVENTION

A polishing method enabling reduction in flow rate of chemical fluids such as a polishing liquid and cleaning liquid without deteriorating process performance and a method for fabricating, or "manufacturing" a semiconductor device in each embodiment will be described below.

First Embodiment

A first embodiment will be described by focusing on a step in which wiring is formed using Cu, which is an example of a conductive material, in a process of fabricating a semiconductor device.

Figure 1:
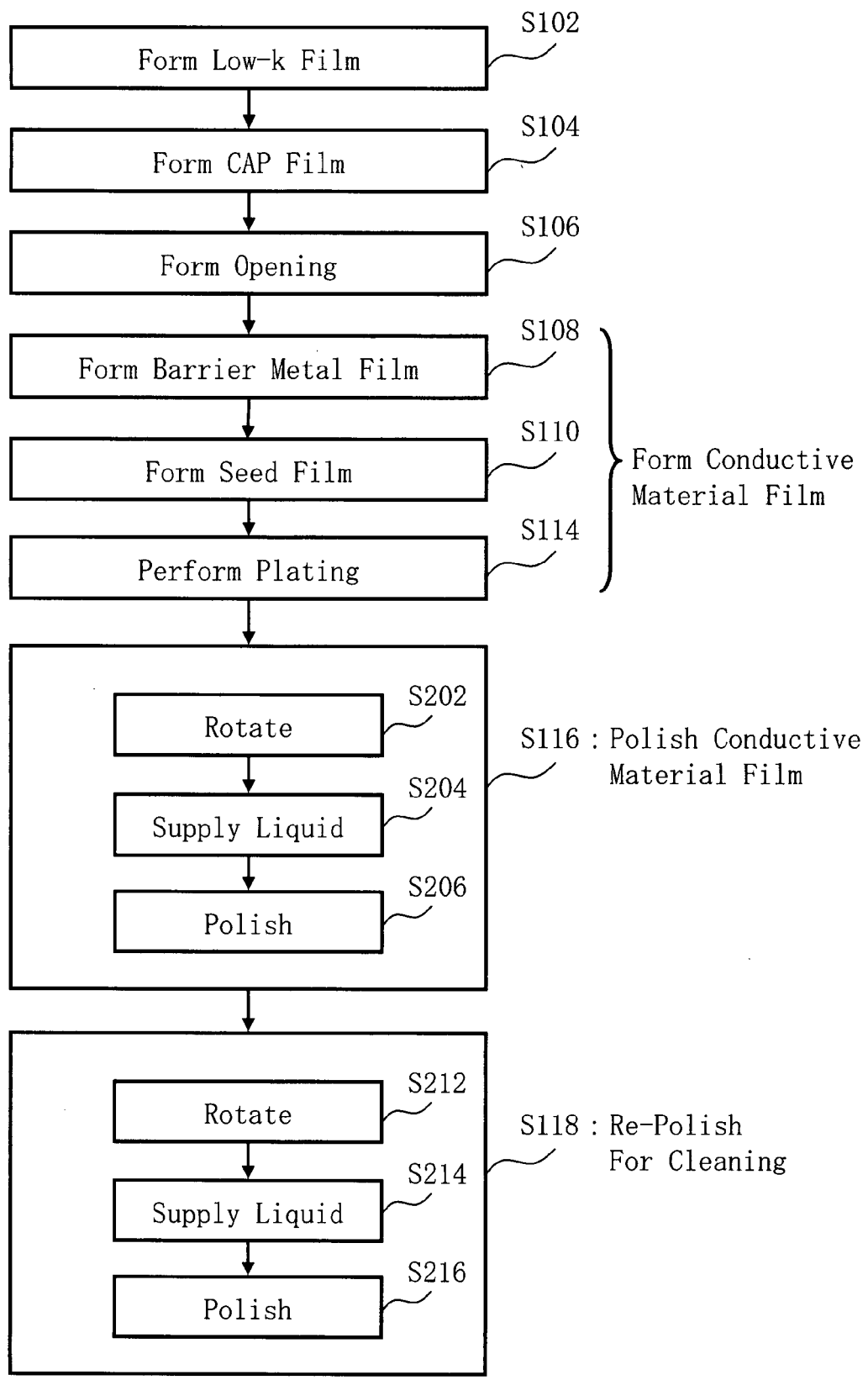
FIG. 1 is a flowchart showing principal parts of a method of manufacturing a semiconductor device in a first embodiment.

The first embodiment will be described below with reference to the drawings. FIG. 1 is a flowchart showing principal parts of a method for fabricating a semiconductor device in the first embodiment. As shown in FIG. 1, a series of steps are performed in the present embodiment. The series of steps include a low-k film formation step in which a thin film of low-k film is formed from an insulating material with low dielectric constant (S102), a cap film formation step in which a cap film is formed (S104), an opening formation step in which an opening is formed (S106), a barrier metal film formation step as a conductive material film formation step in which a conductive material film using a conductive material is formed (S108), a seed film formation step (S110), a plating step (S114), a conductive material film polishing step (S116), and a re-polishing for cleaning step (S118). Then, as the conductive material film polishing step (S116), a series of steps including a rotation step (S202), a liquid supply step (S204), and a polishing step (S206) are performed. Similarly, as the re-polishing for cleaning step (S118), a series of steps including a rotation step (S212), a liquid supply step (S214), and a polishing step (S216) are performed.

Figure 2A:
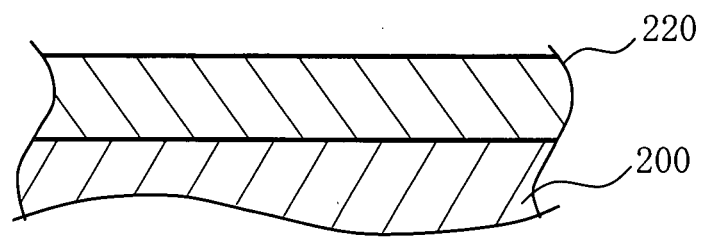
FIGS. 2A to 2C are process sectional views showing steps performed in accordance with the flowchart in FIG. 1.
Figure 2B:
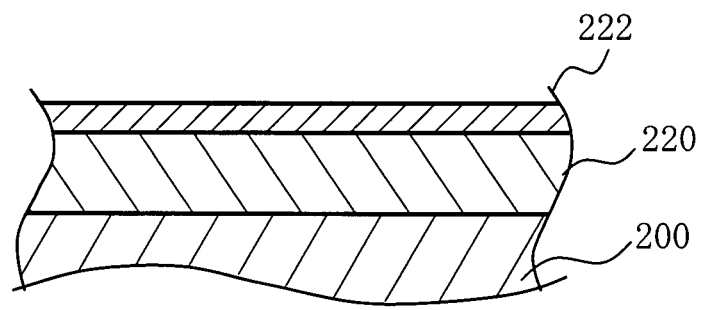
Figure 2C:
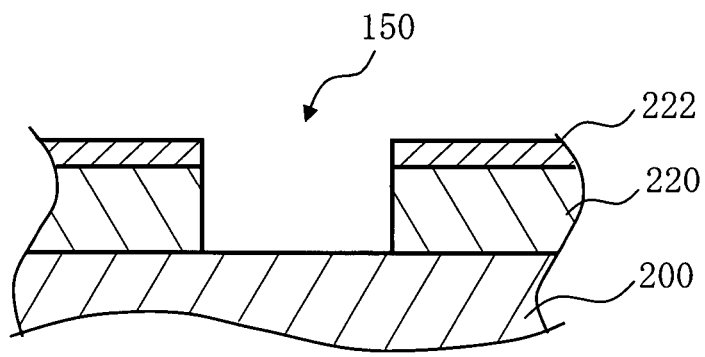

FIGS. 2A to 2C are process sectional views showing steps performed in accordance with the flowchart in FIG. 1. FIGS. 2A to 2C show from the low-k film formation step (S102) to the opening formation step (S106) in FIG. 1. Steps thereafter will be described later.

In FIG. 2A, as the low-k film formation step, a thin film of a low-k film 220 using porous low-dielectric constant insulating material is formed on a substrate 200 as an example of substrate having the thickness of, for example, 200 nm. Forming the low-k film 220 enables to obtain an interlayer dielectric film whose relative dielectric constant k is 3.0 or less. Here, the low-k film 220 is formed, as an example, using LKD (Low-K Dielectric material manufactured by JSR) in which polymethylsiloxane that could become a low-dielectric constant insulating material of relative dielectric constant of less than 2.5 is used. In addition to polymethylsiloxane, the low-k film 220 may also be formed by using at least one selected from the group consisting of a film having a siloxane back bone such as polysiloxane, hydrogen silsesquioxane, and methyl silsesquioxane, a film having as its main component an organic resin such as polyarylene ether, polybenzo-oxazole, and polybenzo-cyclobutene, and a porous film such as a porous silica film. Such a material for the low-k film 220 may have low dielectric constant whose relative dielectric constant is less than 2.5. A spin on dielectric (SOD) coating technique can be used, for example, as a formation method in which a thin film is formed by spin-coating and heat-treating a solution. For example, the low-k film 220 can be formed by forming a film by a spinner, baking the film as a wafer on a hot plate in a nitrogen atmosphere, and finally curing the wafer at temperature higher than the baking temperature in the nitrogen atmosphere on the hot plate. By appropriately adjusting the low-k material and formation conditions, a porous dielectric film having predetermined physical property values can be obtained. A silicon wafer with diameter 200 mm, for example, can be used as the substrate 200. Here, a description of forming device components and plugs positioned in a lower layer of the low-k film 220 is omitted.

In FIG. 2B, as the cap film formation step, a thin film of a silicon oxycarbide (SiOC) film 222 is formed by depositing SiOC having the thickness of, for example, 50 nm on the low-k film 220 as a cap dielectric film by the CVD method. By forming the SiOC film 222, patterns can be formed on the low-k film 220 while protecting the low-k film 220 on which it is difficult to perform lithography directly. In addition to SiOC, a cap dielectric film may also be formed by using at least one insulating material whose relative dielectric constant is 2.5 or more from the group consisting essentially of tetraethoxy silane (TEOS), silicon carbide (SiC), silicon carbohydrate (SiCH), silicon carbo-nitride (SiCN), and SiOCH. The cap dielectric film is formed here by the CVD method, but any other method may also be used.

In FIG. 2C, as the opening formation step, an opening 150, which is a wiring groove structure for preparing damascene wiring in a lithography step and a dry etching step, is formed inside the SiOC film 222 and low-k film 220. The substrate 200 has a resist film formed on the SiOC film 222 through the lithography step such as a resist application step and exposure step (not shown). The exposed SiOC film 222 and the low-k film 220 positioned thereunder are removed using an anisotropic etching technique to allow the opening 150 to be formed on the substrate 200 in a direction substantially perpendicular to the surface of the substrate 200. For example, the opening 150 may be formed by a reactive ion etching technique.

Figure 3A:
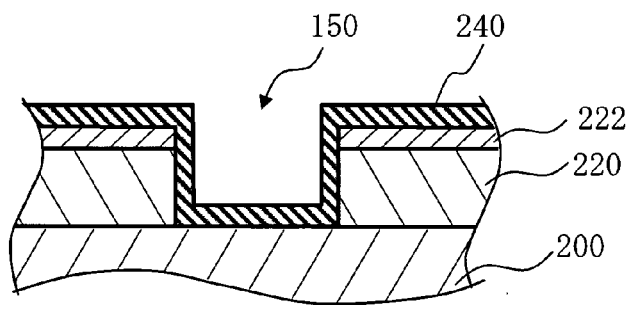
FIGS. 3A to 3C are process sectional views showing steps performed in accordance with the flowchart in FIG. 1.
Figure 3B:
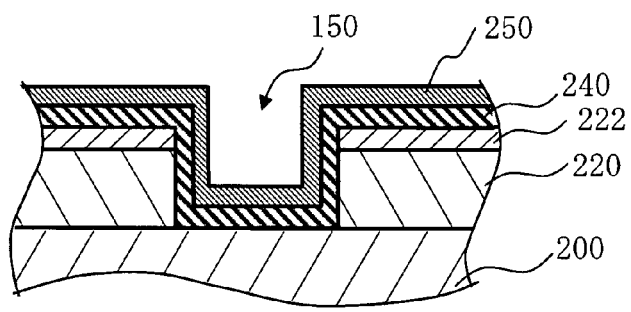
Figure 3C:
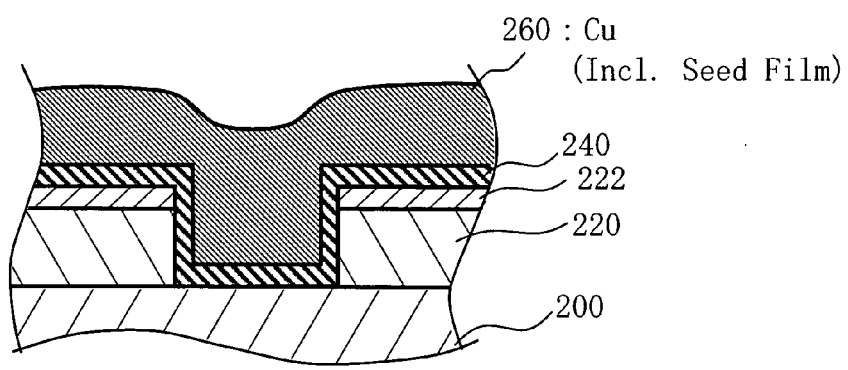

FIGS. 3A to 3C are process sectional views showing steps performed in accordance with the flowchart in FIG. 1. FIGS. 3A to 3C show from the barrier metal film formation step (S108) to the plating step (S114) in FIG. 1. Steps thereafter will be described later.

In FIG. 3A, as the barrier metal film formation step, a barrier metal film 240 using a barrier metal material is formed in the opening 150 and on the surface of the SiOC film 222 formed by the opening formation step. The barrier metal film 240 is formed by depositing a thin film of titanium (Ti) film having the thickness of, for example, 5 nm inside a sputtering device using the sputtering method, which is one of the physical vapor deposition (PVD) methods. The method of depositing a barrier metal material is not limited to the PVD method and also the atomic layer deposition (ALD) method, atomic layer chemical vapor deposition (ALCVD) method, and CVD method may also be used. Coverage can thereby be increased when compared with the PVD method. Examples of the material for the barrier metal film include not only Ti but also a titanium-containing substance such as titanium nitride (TiN), tantalum (Ta), a tantalum-containing substance such as tantalum nitride (TaN), a tungsten-containing substance such as tungsten nitride (WN), or a laminated film using a combination thereof such as Ta and TaN.

In FIG. 3B, as the seed film formation step, a Cu thin film to be a cathode electrode in the next step, the electrolytic plating step, is caused to deposit (form) as a seed film 250 on an inner wall of the opening 150 and the surface of the substrate 200 where the barrier metal film 240 has been formed by the PVD method such as sputtering. Here, the seed film 250 is caused to deposit on the surface of the substrate 200 for the thickness of, for example, 45 nm.

In FIG. 3C, as the plating step, the seed film 250, which is a thin film of a Cu film 260, is caused to deposit as a cathode electrode inside the opening 150 and on the surface of the substrate 200 by an electrochemical growth method such as electrolytic plating. Here, for example, the Cu film 260 having the thickness of 800 nm is caused to deposit, and after deposition, an annealing process is performed, for example, for 30 minutes at temperature 250° C.

Figure 4:
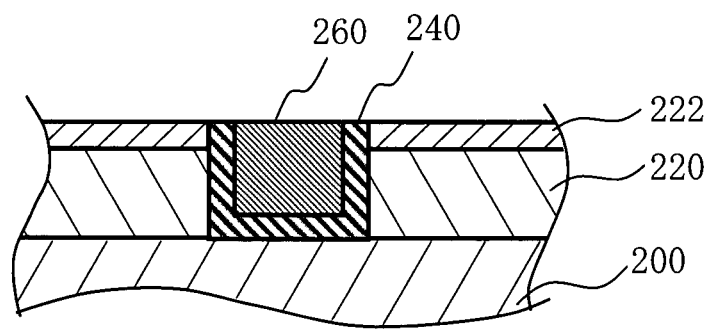
FIG. 4 is a process sectional view showing a step performed in accordance with the flowchart in FIG. 1.

FIG. 4 is a process sectional view showing steps performed in accordance with the flowchart in FIG. 1. FIG. 4 shows from the conductive material film polishing step (S116) to the re-polishing for cleaning step (S118).

In FIG. 4, as the conductive material film polishing step, the surface of the substrate 200 is polished by the CMP method including to remove the Cu film 260 and barrier metal film 240 including the seed film 250, which is to be a wiring layer as a conductive part deposited on the surface excluding the opening, before being flattened as shown in FIG. 4. Internal steps of the conductive material film polishing step to be a method of polishing a conductive material film will be described below.

Figure 5:
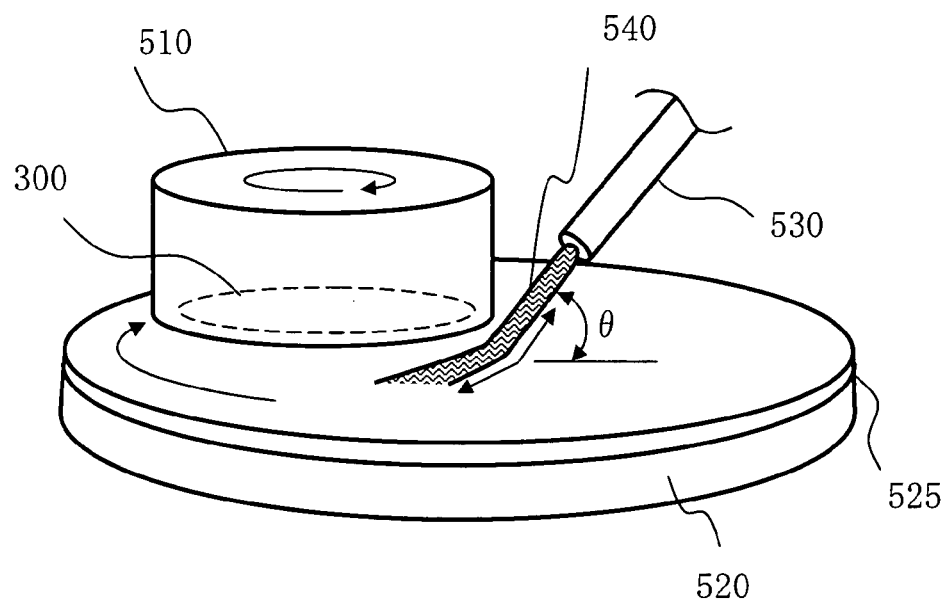
FIG. 5 is a conceptual diagram showing a configuration of a CMP device in the first embodiment.
Figure 6:
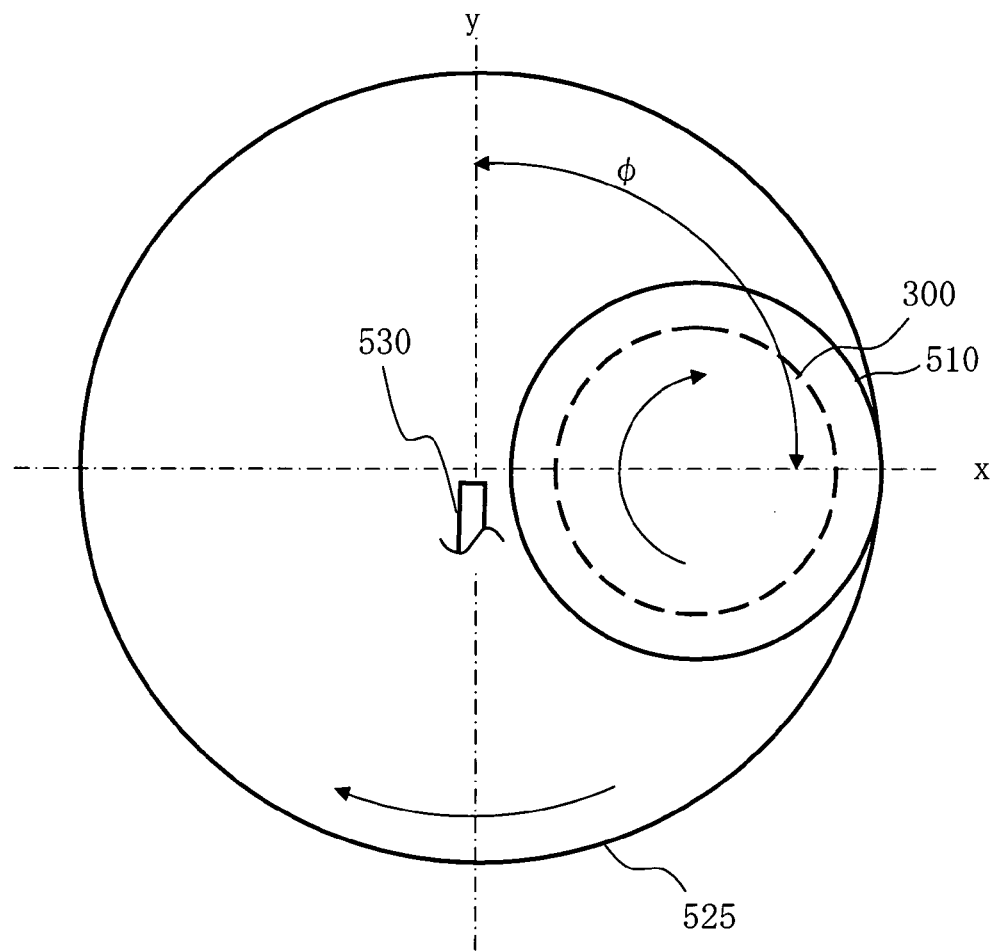
FIG. 6 is a conceptual diagram illustrating an operation of the CMP device when the CMP device in FIG. 5 is viewed from a top surface.
Figure 7:
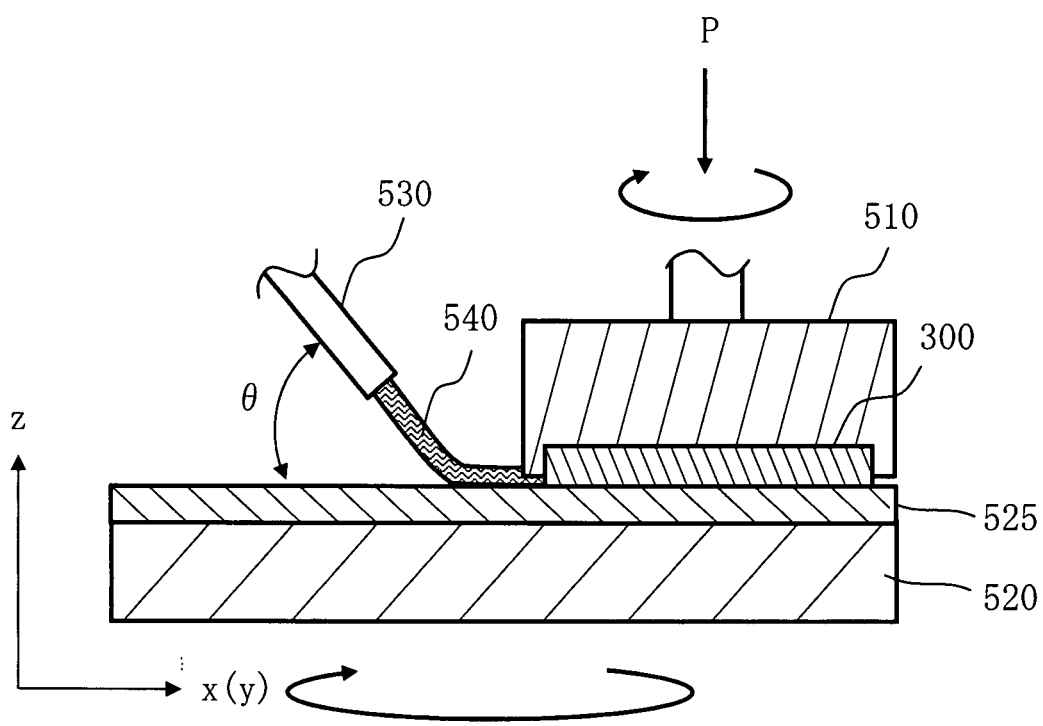
FIG. 7 is a conceptual diagram showing a sectional configuration of the CMP device shown in FIG. 5.

FIG. 5 is a conceptual diagram showing a configuration of a CMP device in the first embodiment. FIG. 6 is a conceptual diagram illustrating an operation of the CMP device when the CMP device in FIG. 5 is viewed from a top surface. FIG. 7 is a conceptual diagram showing a sectional configuration of the CMP device shown in FIG. 5. In FIGS. 5 to 7, in the rotary CMP device to be an example of a polishing machine, a substrate 300 whose surface to be polished is directed downward is held by a carrier 510 on a polishing pad 525 arranged on a turn table 520.

In S202, as the rotation step, the substrate 300 is caused to rotate by rotating the carrier 510, and thereby rotating also the turn table 520. By causing the turn table 520 to rotate, the polishing pad 525 is caused to rotate together.

In S204, as the liquid supply step, a chemical fluid 540 to be a polishing liquid is supplied from a supply nozzle 530 so that the chemical fluid 540 comes into contact with the surface of the polishing pad 525 from substantially an oblique direction with respect to the surface of the polishing pad 525 rotated. In the first embodiment, the chemical fluid 540 to be a polishing liquid is supplied at an angle of θ to the surface of the polishing pad 525, as shown in FIGS. 5 and 7. Also, as shown in FIGS. 5 and 6, the chemical fluid 540 to be a polishing liquid is supplied moving from a substantial center of the polishing pad 525 toward an outer side of the polishing pad 525 when supplying the chemical fluid 540. Then, the chemical fluid 540 to be a polishing liquid is supplied to a fore side of the substrate 300 (upstream side of the substrate 300) positioned in a rotation direction of the turn table 520 shown by the angle φ. In this manner, the chemical fluid 540 to be a polishing liquid is supplied in such a way that the chemical fluid 540 comes into contact with the surface of the polishing pad 525 from an oblique direction upstream of the substrate 300 while moving from the substantial center of the polishing pad 525 toward the outer side of the polishing pad 525. As a consequence, the chemical fluid 540 to be a polishing liquid can be made to hold a velocity component in a diameter direction of the polishing pad 525.

In S206, as the polishing step, the surface of the substrate 300 is polished by pressing the surface of the substrate 300 against the polishing pad 525 using the carrier 510 while supplying the chemical fluid 540 to be a polishing liquid having the velocity component in the diameter direction of the polishing pad 525.

Here, polishing conditions are: $2.94 \times 10^4$ Pa (300 gf/cm$^2$) of the polishing load P, 62 min$^{-1}$ (rpm) of the rotational speed of the carrier 510, and 60 min$^{-1}$ (rpm) of the rotational speed of the turn table 520, and IC1000 (manufactured by RODEL) is used as the polishing pad 525. Polishing is performed until the Cu film 260 including the seed film 250 is all cleared and additionally 30% to provide over-polish.

Then, a polishing liquid to be used for polishing the Cu film 260 (for Cu-CMP) is obtained by mixing each of ammonium persulfate (1.5 wt %) as an oxidizing agent, quinaldic acid (0.3 wt %) and potassium dodecylbenzenesulfonate (0.06 wt %) as complex forming agents, oxalic acid (0.1 wt %) as an organic acid, colloidal silica (0.6 wt %) as abrasive particles, and polyoxyethylene alkyl ether (0.05 wt %) as a surfactant with pure water and adjusting to pH9 by potassium hydroxide (KOH).

Here, when a polishing liquid was supplied with a supply port of the supply nozzle 530 directed from an inner side toward the outer side of the polishing pad 525, polishing was performed under a plurality of conditions. In this case, as parameters used were the flow rate and flow velocity of the polishing liquid, the angle φ of the supply port of the supply nozzle 530 with respect to a center direction of the substrate 300 when a rotation center of the turn table 520 in a polishing pad 525 plane (xy plane) was defined as the center, and the angle θ of the supply port of the supply nozzle 530 with respect to the polishing pad 525 plane in a direction (z direction) perpendicular to the polishing pad 525 plane. Then, the polishing rate, amount of dishing, and polishing temperature under each condition were compared. Under any condition, the liquid contact position of the polishing liquid with the polishing pad 525 was configured to be the substantial rotation center position of the polishing pad 525. This liquid contact position is preferably on the side of the rotation center position of the polishing pad 525 rather than at an end of the substrate 300. Then, the Reynolds number under each condition upon supply was also calculated.

As a conventional example 1.0, the supply nozzle 530 was arranged at the substantial center position (substantial rotation center position of the polishing pad 525) of the turn table 520 directed toward right below (θ=90 degrees). Then, a polishing liquid (slurry) to be the chemical fluid 540 with the flow rate of 0.3 L/min (300 ml/min) and the flow velocity at that time of 0.3 m/sec (30 cm/sec) at the supply port of the supply nozzle 530 was supplied from the supply nozzle 530 onto the polishing pad 525 plane. The supply nozzle 530 had a piping radius of $0.23 \times 10^{-2}$ m (0.23 cm).

As a sample 1.0, the supply nozzle 530 was arranged at the substantial center position (substantial rotation center position of the polishing pad 525) of the turn table 520 directed toward right below (θ=90 degrees). Then, a polishing liquid (slurry) to be the chemical fluid 540 with the flow rate of 0.15 L/min (150 ml/min) and the flow velocity at that time of 0.15 m/sec (15 cm/sec) at the supply port of the supply nozzle 530 was supplied from the supply nozzle 530 onto the polishing pad 525 plane. The supply nozzle 530 had a piping radius of $0.23 \times 10^{-2}$ m (0.23 cm).

As a sample 1.1, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.15 m/sec (15 cm/sec) at the supply port of the supply nozzle 530 was supplied from the supply nozzle 530 onto the polishing pad 525 plane. The supply nozzle 530 had a piping radius of $0.23 \times 10^{-2}$ m (0.23 cm).

As a sample 1.2, the supply nozzle 530 was arranged at the substantial center position (substantial rotation center position of the polishing pad 525) of the turntable 520 at angles of $\phi=90$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.2 m/sec (20 cm/sec) at the supply port of the supply nozzle 530 was supplied from the supply nozzle 530 onto the polishing pad 525 plane. The supply nozzle 530 had a piping radius of $0.2 \times 10^{-2}$ m (0.2 cm).

As a sample 1.3, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.25 m/sec (25 cm/sec) at the supply port of the supply nozzle 530 was supplied from the supply nozzle 530 onto the polishing pad 525 plane. The supply nozzle 530 had a piping radius of $0.18 \times 10^{-2}$ m (0.18 cm).

As a sample 1.4, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.30 m/sec (30 cm/sec) at the supply port of the supply nozzle 530 was supplied from the supply nozzle 530 onto the polishing pad 525 plane. The supply nozzle 530 had a piping radius of $0.16 \times 10^{-2}$ m (0.16 cm).

As a sample 1.5, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.6, the supply nozzle 530 was arranged at the substantial center position (substantial rotation center position of the polishing pad 525) of the turn table 520 at angles of $\phi=90$ degrees and $\theta=25$ degrees with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.7, the supply nozzle 530 was arranged at the substantial center position (substantial rotation center position of the polishing pad 525) of the turn table 520 at angles of $\phi=90$ degrees and $\theta=45$ degrees with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.8, the supply nozzle 530 was arranged at the substantial center position (substantial rotation center position of the polishing pad 525) of the turn table 520 at angles of $\phi=90$ degrees and $\theta=60$ degrees with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.9, the supply nozzle 530 was arranged at the substantial center position (substantial rotation center position of the polishing pad 525) of the turn table 520 at angles of $\phi=90$ degrees and $\theta=75$ degrees with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.10, the supply nozzle 530 was arranged at the substantial center position (substantial rotation center position of the polishing pad 525) of the turn table 520 directed toward right below ($\theta=90$ degrees). Then, a polishing liquid (slurry) to be the chemical fluid 540 with the flow rate of 0.15 L/min (150 ml/min) and the flow velocity at that time of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.11, the supply nozzle 530 was arranged at the substantial center position (substantial rotation center position of the polishing pad 525) of the turntable 520 at angles of $\phi=135$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

As a sample 1.12, the supply nozzle 530 was arranged at the substantial center position (substantial rotation center position of the polishing pad 525) of the turntable 520 at angles of $\phi=270$ degrees and $\theta=0$ degree with the supply port of the supply nozzle 530 directed toward the outer side of the polishing pad 525. Then, a polishing liquid (slurry) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane. The supply nozzle 530 had a piping radius of $0.15 \times 10^{-2}$ m (0.15 cm).

Table 1 below shows polishing results under the above conditions.

effects of the flow velocity were checked by increasing the flow velocity with the angle $\phi=90$ degrees and the angle $\theta=0$ degree while the flow rate is reduced by half. Next, in the samples 1.5 to 1.10, the angle $\theta$ was increased from the condition of the sample 1.5 to check effects of the angle $\theta$.

TABLE 1

| | Slurry Flow Rate ml/min | Flow Velocity cm/sec | Direction (X, Y) Degree | Direction (Z) Degree | Reynolds Number | Polishing Rate nm/min | Dishing nm | Temp. deg. | Determination |
|---|---|---|---|---|---|---|---|---|---|
| Conventional Example 1.0 | 300 | 30 | — | 90 | 1258 | 1000 | 20 | 50 | GOOD |
| Sample 1.0 Flow Velocity | 150 | 15 | — | 90 | 629 | 700 | 80 | 60 | NG |
| Sample 1.1 | 150 | 15 | 90 | 0 | 629 | 750 | 60 | 56 | NG |
| Sample 1.2 | 150 | 20 | 90 | 0 | 723 | 900 | 26 | 53 | GOOD |
| Sample 1.3 | 150 | 25 | 90 | 0 | 804 | 1030 | 20 | 50 | GOOD |
| Sample 1.4 | 150 | 30 | 90 | 0 | 904 | 1180 | 18 | 48 | BETTER |
| Sample 1.5 Z | 150 | 35 | 90 | 0 | 965 | 1240 | 18 | 48 | BETTER |
| Sample 1.6 | 150 | 35 | 90 | 25 | 965 | 1200 | 18 | 48 | BETTER |
| Sample 1.7 | 150 | 35 | 90 | 45 | 965 | 1120 | 20 | 48 | GOOD |
| Sample 1.8 | 150 | 35 | 90 | 60 | 965 | 940 | 25 | 52 | GOOD |
| Sample 1.9 | 150 | 35 | 90 | 75 | 965 | 800 | 40 | 55 | NG |
| Sample 1.10 XY | 150 | 35 | — | 90 | 965 | 720 | 75 | 58 | NG |
| Sample 1.11 | 150 | 35 | 135 | 0 | 965 | 900 | 25 | 52 | GOOD |
| Sample 1.12 | 150 | 35 | 270 | 0 | 965 | 800 | 40 | 60 | NG |

Criteria were defined as follows. Samples whose polishing rate was slower than 850 nm/mm or whose dishing amount exceeded 30 nm were determined to be "NG". Samples whose polishing rate was 850 nm/min or more and less than 1150 nm/min and whose dishing amount was 30 nm or less were determined to be "GOOD". Then, samples whose polishing rate was 1150 nm/min or more and whose dishing amount was 30 nm or less were determined to be "BETTER".

Here, the flow velocity was measured using an ultrasonic flowmeter. The ultrasonic flowmeter is a transmitter/receiver that, after bringing sensors being vibrated by ultrasonic waves into close contact with piping of the supply nozzle 530 at two locations, causes one sensor to transmit ultrasonic waves before being received by the other sensor. A transmission signal is affected by the velocity of a liquid inside the piping, which is detected as change of a received signal. The amount of the change is calculated to display a flow velocity. The flow velocity was also adjusted by changing the piping radius of the supply nozzle 530.

If an average flow velocity is U, an inside diameter of the piping is d, and a coefficient of kinetic viscosity of the slurry is $\nu$, the Reynolds number Re can be calculated as $Re=Ud/\nu$. The average flow velocity U is assumed to be half the maximum flow velocity Um. Also, the average flow velocity under each condition is assumed to be the flow velocity under each condition described above.

In Table 1, the conventional example 1.0 represents the current condition, under which the polishing rate was 1000 nm/min, the Cu dishing amount was 20 nm, and the temperature during polishing was steadily 50 degrees or below. In the sample 1.0, on the other hand, which is a case in which the flow rate of slurry is simply reduced from the current condition, the polishing rate was 700 nm/min, the Cu dishing amount was 80 nm, and the temperature during polishing reached 60 degrees, leading to unstable polishing. This result shows that simply reducing the flow rate of the slurry does not meet process performance. Then, in the samples 1.1 to 1.5, Further, in the samples 1.5, 1.11, and 1.12, the angle $\phi$ was increased from the condition of the sample 1.5 to check effects of the angle $\phi$.

From the above results, the supply method shown in the sample 1.5 was found to be most effective. That is, the flow velocity was increased to 0.35 m/min (35 cm/min), and the supply nozzle 530 was set to be $\phi=90$ degrees upstream with respect to the center of the substrate 300 and directed in parallel ($\theta=0$ degree) with the polishing pad 525. At this point, the inside diameter of the supply port of the supply nozzle 530 was made thinner from 4.6 mm to 3 mm to increase the flow velocity. By adopting such conditions, the polishing rate reached 1240 nm/min, which is faster than before reducing the flow rate, the amount of Cu dishing was small with 18 nm, and the temperature during polishing could be stabilized at 48° C. or below. Also, the results of the samples 1.1 to 1.5 show that much effect can be obtained by increasing the flow velocity, even if the flow rate is decreased. Then, by increasing the flow velocity up to 0.25 m/sec (25 cm/sec), characteristics equivalent to those before reducing the flow rate of the polishing liquid by half can be obtained. Further, when the flow velocity was increased up to 0.35 m/sec (35 cm/sec), characteristics are rather improved when compared before reducing the flow rate of the polishing liquid by half, as shown in Table 1. That is, increasing the flow velocity produces a better result. Considering that such performance can be obtained even if the flow rate of the polishing liquid is reduced by half, it is apparent how wasteful conventional supply methods have been. However, if the flow velocity is increased too much, the polishing liquid could rise like a mist to generate dust and, if, for this reason, the inside diameter of the supply port of the nozzle 530 is made extremely thin, the polishing liquid could stick to the supply port or nearby, causing a malfunction. Therefore, the flow velocity can be set appropriately within a range in which such problems do not occur. Next, the results of the samples 1.5, 1.11 and 1.12 show that, while the angle $\phi=90$ degrees is "BETTER" and the angle $\phi=135$ degrees is "GOOD", the angle $\phi=270$ degrees is "NG". This shows that supplying the polishing liquid directed toward the upstream side of the substrate 300 is effective. That is, if supplied in a direction exceeding the angle $\phi$ of 180 degrees and directed toward the angle $\phi$ of 270 degrees with respect to the center of the substrate 300 like the sample 1.12, it is evident that there is little effect even if the flow velocity is increased. Then, the results of the samples 1.5 to 1.10 show that, from a standpoint of bringing the polishing liquid into contact with the surface of the polishing pad 525 reliably from an oblique direction with respect to the surface of the polishing pad 525, the angle $\theta$ is preferably close to 0, but good enough when the angle $\theta$ is 60 degrees or less. Dependence on the angle $\theta$ at which the polishing liquid jumps (direction in which the polishing liquid is supplied) is small. However, if the angle $\theta$ is 90 degrees, like the sample 1.10, there is no effect at all even if the flow velocity is increased. This suggests that it is important to supply a polishing liquid to the upstream side of the substrate 300 by making the polishing liquid hold a velocity component in a substrate plane direction and a minimum jumping angle is required for this purpose.

Based on the above results and further, after trials and errors by the inventors, the following ranges were found to be suitable. It is suitable if the discharge angle $\phi$ in an xy direction of the chemical fluid 540 to be a polishing liquid discharged from the supply nozzle 530 is set between 45 degrees and 180 degrees toward the upstream direction of the rotation direction of the polishing pad 525 with respect to the substrate 300. Also, it is suitable if the angle $\theta$ in a z-direction of the chemical fluid 540 to be a polishing liquid discharged from the supply nozzle 530 is set between 0 degree and 60 degrees with respect to the polishing pad 525 plane. Then, it is suitable if the flow velocity of the supplied chemical fluid 540 to be a polishing liquid is supplied at 0.2 m/sec (20 cm/sec) or more and 1 m/sec (100 cm/sec) or less. With the above settings, the amount of supply of the chemical fluid 540 to be a polishing liquid, which conventionally requires 0.3 L/min (300 ml/min), can be reduced to 0.05 L/min (50 ml/min) to 0.2 L/min (200 ml/min) without deteriorating process performance.

In a conventional CMP device, a polishing liquid is supplied from above in a direction substantially perpendicular to the surface of the polishing pad 525. In other words, even if the supply nozzle is not right below and a little slanted, the polishing liquid is dropped in a substantially vertical direction and comes into contact with the surface to be polished from the vertical direction. Thus, the polishing liquid supplied to the surface of the polishing pad 525 just spreads to the outer side of the polishing pad 525 due to a centrifugal force resulting from rotation of the turn table 520. Consequently, to supply a sufficient amount of the polishing liquid required for polishing the substrate 300 to the surface to be polished, a large flow rate is needed at the conventional rotational speed of the turn table 520. If, for example, the flow rate of the polishing liquid that conventionally requires the flow rate of 0.3 L/min (300 ml/min) is reduced by half to 0.15 L/min (150 ml/min), as described above, a rise in polishing temperature, reduced polishing rate, and deterioration in flattening were caused. In contrast, in the present embodiment, by slanting the supply nozzle 530 to make the chemical fluid 540 to be a polishing liquid hold a velocity component in the diameter direction of the polishing pad 525, movement of the polishing liquid in the diameter direction due to a centrifugal force resulting from rotation of the turn table 520 is compensated so that a sufficient amount of polishing liquid can be supplied to the surface to be polished by a flow rate smaller than a conventional one.

Here, the polishing liquid for Cu-CMP described above can use, in addition to ammonium persulfate, potassium persulfate and hyperhydration (hydrogen peroxide) as an oxidizing agent. Then, examples of a complex forming agent include, in addition to quinaldic acid, quinolinic acid, benzotriazole, alanine, and glycine, and examples of an organic acid include, in addition to oxalic acid, maleic acid, citric acid, malic acid, and malonic acid. Further, in addition to colloidal silica as abrasive particles, fumed silica, colloidal alumina, fumed alumina, ceria, titania, organic particles, or composite particles in which organic and inorganic particles are integrated can be used. Examples of a surfactant include not only polyoxyethylene alkyl ether, but also potassium dodecylbenzenesulfonate, ammonium dodecylbenzenesulfonate, polyacrylic acid, potassium polyacrylate, ammonium polyacrylate, polyvinyl pyrrolidone, and an acetylene glycol nonionic surfactant.

In FIG. 6, the supply port of the supply nozzle 530 is arranged so that the chemical fluid 540 to be a polishing liquid is supplied from the substantial center position of the polishing pad 525 in the diameter direction of the polishing pad 525, but the present embodiment is not limited to this. Any arrangement position and direction of the supply nozzle 530 may be adopted that can make the chemical fluid 540 to be a polishing liquid hold a velocity component in the diameter direction larger than that in a circumferential direction of the polishing pad 525 on the upstream side of the substrate 300.

After removing the excessive Cu film 260 by the CMP method as described above, the excessive barrier metal film 240 is also removed by the CMP method before being flattened as shown in FIG. 4. The barrier metal film 240 may be polished by the same device or another device.

Next, as the re-polishing for cleaning step, after the excessive Cu film 260 is removed by the CMP method, and then Ti, the barrier metal film 240, is polished, re-polishing for cleaning is performed with the cleaning liquid using the CMP device. An internal step of the re-polishing for cleaning step, which is a polishing method using the cleaning liquid, will be described below. The same CMP device as that shown in FIGS. 5 to 7 may be used as a CMP device for re-polishing for cleaning.

Then, the substrate 300 whose surface to be polished is directed downward is held by the carrier 510 on the polishing pad 525 arranged on the turn table 520.

In S212, as the rotation step, the substrate 300 is caused to rotate by rotating the carrier 510, and thereby rotating also the turn table 520. By causing the turn table 520 to rotate, the polishing pad 525 is caused to rotate together.

In S214, as the liquid supply step, the chemical fluid 540 to be a cleaning liquid is supplied from the supply nozzle 530 so that the chemical fluid 540 comes into contact with the surface of the polishing pad 525 from substantially an oblique direction with respect to the surface of the polishing pad 525 rotated. Here, in the first embodiment, the chemical fluid 540 to be a cleaning liquid is supplied at an angle of $\theta$ to the surface of the polishing pad 525, as shown in FIGS. 5 and 7. Also, as shown in FIGS. 5 and 6, the chemical fluid 540 to be a cleaning liquid is supplied moving from the substantial center of the polishing pad 525 toward the outer side when supplying the chemical fluid 540. Then, the chemical fluid 540 to be a cleaning liquid is supplied to the fore side of the substrate 300 (upstream side of the substrate 300) positioned in the rotation direction of the turn table 520 shown by the angle $\phi$. In this manner, the chemical fluid 540 to be a cleaning liquid is supplied in such a way that the chemical fluid 540 comes into contact with the surface of the polishing pad 525 from an oblique direction upstream of the substrate 300 while moving from the substantial center of the polishing pad 525 toward the outer side of the polishing pad 525. As a consequence, the chemical fluid 540 to be a cleaning liquid can be made to hold a velocity component in the diameter direction of the polishing pad 525.

In S216, as the polishing step, the surface of the substrate 300 is polished by pressing the surface of the substrate 300 against the polishing pad 525 using the carrier 510 while supplying the chemical fluid 540 to be a cleaning liquid having the velocity component in the diameter direction of the polishing pad 525.

Here, polishing conditions were: $0.98 \times 10^4$ Pa ($100$ gf/cm$^2$) of the polishing load P, $62$ min$^{-1}$ (rpm) of the rotational speed of the carrier 510, and $60$ min$^{-1}$ (rpm) of the rotational speed of the turn table 520, and IC1000 (manufactured by RODEL) was used as the polishing pad 525. Polishing was performed for 30 seconds. Then, a solution of citric acid 0.2 wt % was used as the chemical fluid 540 to be a cleaning liquid used for re-polishing for cleaning.

Here, also for re-polishing for cleaning, like Cu-CMP, polishing was performed under a plurality of conditions when a cleaning liquid was supplied with the supply port of the supply nozzle 530 directed from the inner side toward the outer side of the polishing pad 525. As parameters used were the flow rate and flow velocity of the cleaning liquid, the angle $\phi$ of the supply port of the supply nozzle 530 with respect to the center of the substrate 300 when the center of the turn table 520 in the polishing pad 525 plane (xy plane) was defined as the center, and the angle $\theta$ of the supply port of the supply nozzle 530 with respect to the polishing pad 525 plane in a direction (z direction) perpendicular to the polishing pad 525 plane. Then, a dust count and the number of occurrences of corrosion for each substrate under each condition were compared. Under any condition, the liquid contact position of the cleaning liquid with the polishing pad 525 was configured to be the substantial rotation center position of the polishing pad 525. This liquid contact position is preferably on the side of the rotation center position of the polishing pad 525 rather than at an end of the substrate 300.

As a conventional example 2.0, the supply nozzle 530 was arranged at the substantial center position (substantial rotation center position of the polishing pad 525) of the turn table 520 directed toward right below ($\theta=90$ degrees). Then, a cleaning liquid to be the chemical fluid 540 with the flow rate of 0.3 L/min (300 ml/min) and the flow velocity at that time of 0.3 m/sec (30 cm/sec) at the supply port of the supply nozzle 530 was supplied from the supply nozzle 530 onto the polishing pad 525 plane.

As a sample 2.0, the supply nozzle 530 was arranged at the substantial center position (substantial rotation center position of the polishing pad 525) of the turn table 520 directed toward right below ($\theta=90$ degrees). Then, a cleaning liquid to be the chemical fluid 540 with the flow rate of 0.15 L/min (150 ml/min) and the flow velocity at that time of 0.15 m/sec (15 cm/sec) at the supply port of the supply nozzle 530 was supplied from the supply nozzle 530 onto the polishing pad 525 plane.

As a sample 2.1, the supply nozzle 530 was arranged at the substantial center position (substantial rotation center position of the polishing pad 525) of the turntable 520 at angles of $\phi=90$ degrees and $\theta=0$ degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.15 m/sec (15 cm/sec) at the supply port of the supply nozzle 530 was supplied from the supply nozzle 530 onto the polishing pad 525 plane.

As a sample 2.2, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.2 m/sec (20 cm/sec) at the supply port of the supply nozzle 530 was supplied from the supply nozzle 530 onto the polishing pad 525 plane.

As a sample 2.3, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.25 m/sec (25 cm/sec) at the supply port of the supply nozzle 530 was supplied from the supply nozzle 530 onto the polishing pad 525 plane.

As a sample 2.4, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.30 m/sec (30 cm/sec) at the supply port of the supply nozzle 530 was supplied from the supply nozzle 530 onto the polishing pad 525 plane.

As a sample 2.5, the supply nozzle 530 was arranged at the substantial center position (substantial rotation center position of the polishing pad 525) of the turn table 520 at angles of $\phi=90$ degrees and $\theta=0$ degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.6, the supply nozzle 530 was arranged at the substantial center position (substantial rotation center position of the polishing pad 525) of the turntable 520 at angles of $\phi=90$ degrees and $\theta=25$ degrees with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.7, the supply nozzle 530 was arranged at the substantial center position (substantial rotation center position of the polishing pad 525) of the turntable 520 at angles of $\phi=90$ degrees and $\theta=45$ degrees with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.8, the supply nozzle 530 was arranged at the substantial center position (substantial rotation center position of the polishing pad 525) of the turntable 520 at angles of $\phi=90$ degrees and $\theta=60$ degrees with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.9, the supply nozzle 530 was arranged at the substantial center position (substantial rotation center position of the polishing pad 525) of the turn table 520 at angles of ϕ=90 degrees and θ=75 degrees with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.10, the supply nozzle 530 was arranged at the substantial center position (substantial rotation center position of the polishing pad 525) of the turn table 520 directed toward right below (θ=90 degrees). Then, a cleaning liquid to be the chemical fluid 540 with the flow rate of 0.15 L/min (150 ml/min) and the flow velocity at that time of 0.35 m/sec (35 cm/sec) at the supply port of the supply nozzle 530 was supplied from the supply nozzle 530 onto the polishing pad 525 plane.

As a sample 2.11, the supply nozzle 530 was arranged at the substantial center position (substantial rotation center position of the polishing pad 525) of the turn table 520 at angles of ϕ=135 degrees and θ=0 degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 2.12, the supply nozzle 530 was arranged at the substantial center position (substantial rotation center position of the polishing pad 525) of the turn table 520 at angles of ϕ=270 degrees and θ=0 degree with the supply port of the supply nozzle 530 directed toward the outer side of the polishing pad 525. Then, a cleaning liquid to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

Table 2 below shows results of re-polishing for cleaning under the above conditions.

Criteria were defined as follows. Samples whose dust count exceeded 50 or whose number of occurrences of corrosion exceeded 10 per substrate were determined to be "NG". Samples whose dust count was 20 or more and less than 50 and whose number of occurrences of corrosion was 10 or less were determined to be "GOOD". Then, samples whose dust count was less than 20 and whose number of occurrences of corrosion was 10 or less were determined to be "BETTER".

Here, like Cu-CMP, the flow velocity was measured using an ultrasonic flowmeter. The flow velocity was also adjusted by changing the piping radius of the supply nozzle 530.

In Table 2, the conventional example 2.0 represents the current condition, under which the dust count was 30 and the number of occurrences of corrosion was 0 for the substrate. In the sample 2.0, on the other hand, which is a case in which the flow rate of the cleaning liquid is simply reduced from the current condition, the dust count was 750 and the number of occurrences of corrosion was 82, resulting in "NG" polishing. This result shows that simply reducing the flowrate of the cleaning liquid does not meet process performance. Then, in the samples 2.1 to 2.5, effects of the flow velocity were checked by increasing the flow velocity with the angle ϕ=90 degrees and the angle θ=0 degree while the flow rate is reduced by half. Next, in the samples 2.5 to 2.10, the angle θ was increased from the condition of the sample 2.5 to check effects of the angle θ. Further, in the samples 2.5, 2.11, and 2.12, the angle ϕ was increased from the condition of the sample 2.5 to check effects of the angle ϕ.

From the above results, the supply method shown in the sample 2.4 was found to be most effective. That is, the flow velocity was increased to 0.3 m/min (30 cm/min), and the supply nozzle 530 was set to be ϕ=90 degrees upstream with respect to the center of the substrate 300 and directed in parallel (θ=0 degree) with the polishing pad 525. By adopting such conditions, with the dust count 15 and the number of occurrences of corrosion 2, it becomes possible to significantly reduce particularly the dust count. Also, the results of the samples 2.1 to 2.5 show that much effect can be obtained by increasing the flow velocity. Then, by increasing the flow velocity up to 0.25 m/sec (25 cm/sec), characteristics substantially equivalent to those before reducing the flow rate of

TABLE 2

|  | Slurry Flow Rate ml/min | Flow Velocity cm/sec | Direction (X, Y) Degree | Direction (Z) Degree | Dust pcs/wafer | Corrosion pcs/wafer | Determination |
|---|---|---|---|---|---|---|---|
| Conventional Example 2.0 | 300 | 30 | — | 90 | 30 | 0 | GOOD |
| Sample 2.0 Flow Velocity | 150 | 15 | — | 90 | 750 | 82 | NG |
| Sample 2.1 | 150 | 15 | 90 | 0 | 73 | 16 | NG |
| Sample 2.2 | 150 | 20 | 90 | 0 | 35 | 2 | GOOD |
| Sample 2.3 | 150 | 25 | 90 | 0 | 34 | 5 | GOOD |
| Sample 2.4 | 150 | 30 | 90 | 0 | 15 | 2 | BETTER |
| Sample 2.5 Z | 150 | 35 | 90 | 0 | 18 | 3 | BETTER |
| Sample 2.6 | 150 | 35 | 90 | 25 | 25 | 2 | GOOD |
| Sample 2.7 | 150 | 35 | 90 | 45 | 22 | 3 | GOOD |
| Sample 2.8 | 150 | 35 | 90 | 60 | 36 | 2 | GOOD |
| Sample 2.9 | 150 | 35 | 90 | 75 | 78 | 18 | NG |
| Sample 2.10 XY | 150 | 35 | — | 90 | 520 | 65 | NG |
| Sample 2.11 | 150 | 35 | 135 | 0 | 22 | 3 | GOOD |
| Sample 2.12 | 150 | 35 | 270 | 0 | 814 | 55 | NG | the cleaning liquid by half can be obtained. Further, when the flow velocity was increased up to 0.30 m/sec (30 cm/sec), characteristics are rather improved when compared before reducing the flow rate of the cleaning liquid by half as shown in Table 2. This also applies when the flow velocity is increased up to 0.35 m/sec (35 cm/sec). That is, increasing the flow velocity produces a better result. Considering that such performance can be obtained even if the flow rate of the cleaning liquid is reduced by half, it is apparent how wasteful conventional supply methods have been. Next, as the results of the samples 2.5, 2.11 and 2.12 show that, while the angle φ=90 degrees is "BETTER" and the angle φ=135 degrees is "GOOD", the angle φ=270 degrees is "NG". This shows that supplying the cleaning liquid directed toward the upstream side of the substrate 300 is effective. That is, if supplied in a direction exceeding the angle φ of 180 degrees and directed toward the angle φ of 270 degrees with respect to the center of the substrate 300 like the sample 2.12, it is evident that there is little effect even if the flow velocity is increased. Then, the results of the samples 2.5 to 2.10 show that, from a standpoint of bringing the cleaning liquid into contact with the surface of the polishing pad 525 reliably from an oblique direction with respect to the surface of the polishing pad 525, the angle θ is preferably 45 degrees or less, but good enough when the angle θ is 60 degrees or less. Dependence on the angle θ at which the cleaning liquid jumps (direction in which the cleaning liquid is supplied) is small. However, if the angle θ is 90 degrees, like the sample 2.10, there is no effect at all even if the flow velocity is increased. This suggests that it is important to supply a cleaning liquid to the upstream side of the substrate 300 by making the cleaning liquid hold a velocity component in the substrate plane direction is and a minimum jumping angle is required for this purpose.

Based on the above results and further, after trials and errors by the inventors, the following ranges were found to be suitable. It is suitable if the discharge angle φ in the xy direction of the chemical fluid 540 to be a cleaning liquid discharged from the supply nozzle 530 is set between 45 degrees and 180 degrees toward the upstream direction of the rotation direction of the polishing pad 525 with respect to the substrate 300. Also, it is suitable if the angle θ in the z direction of the chemical fluid 540 to be a cleaning liquid discharged from the supply nozzle 530 is set between 0 degree and 60 degrees with respect to the polishing pad 525 plane. Then, it is suitable if the flow velocity of the supplied chemical fluid 540 to be a cleaning liquid is supplied at 0.2 m/sec (20 cm/sec) or more and 1 m/sec (100 cm/sec) or less. With the above settings, the amount of supply of the chemical fluid 540 to be a cleaning liquid, which conventionally requires 0.3 L/min (300 ml/min), can be reduced to 0.05 L/min (50 ml/min) to 0.2 L/min (200 ml/min) without deteriorating process performance.

In a conventional CMP device used for re-polishing for cleaning, a cleaning liquid is supplied from above in a direction substantially perpendicular to the surface of the polishing pad 525. In other words, even if the supply nozzle is not right below and a little slanted, the cleaning liquid is dropped in a substantially vertical direction and comes into contact with the surface to be polished from the vertical direction. Thus, the cleaning liquid supplied to the surface of the polishing pad 525 just spreads to the outer side of the polishing pad 525 due to a centrifugal force resulting from rotation of the turn table 520. Consequently, to supply a sufficient amount of the cleaning liquid required for polishing the substrate 300 to the surface to be polished, a large flow rate is needed at the conventional rotational speed of the turn table 520. If, for example, the flow rate of the cleaning liquid that conventionally requires the flow rate of 0.3 L/min (300 ml/min) is reduced by half to 0.15 L/min (150 ml/min), as described above, the dust count on a dielectric film increased from 30/substrate to 750/substrate. Also, occurrences of corrosion at Cu wiring ends were confirmed and the number of occurrences of corrosion increased from 0/substrate to 82/substrate. In contrast, in the present embodiment, by making the chemical fluid 540 to be a cleaning liquid hold a velocity component in the diameter direction of the polishing pad 525, movement of the cleaning liquid in the diameter direction due to a centrifugal force resulting from rotation of the turntable 520 is compensated so that a sufficient amount of the cleaning liquid can be supplied to the surface to be polished by a flow rate smaller than a conventional one.

In FIG. 6, like Cu-CMP, the supply port of the supply nozzle 530 is arranged so that the chemical fluid 540 to be a cleaning liquid is supplied from the substantial center position of the polishing pad 525 in the diameter direction of the polishing pad 525, but the present embodiment is not limited to this. Any arrangement position and direction of the supply nozzle 530 may be adopted that can make the chemical fluid 540 to be a polishing liquid hold a velocity component in the diameter direction larger than that in a circumferential direction of the polishing pad 525 on the upstream side of the substrate 300.

The damascene wiring shown in FIG. 4 can be formed as described above. Henceforth, multi-layer wiring can also be formed in the same manner. Dual damascene wiring can also be formed in the same manner.

As described above, the flow rate of the polishing liquid can be reduced by supplying the chemical fluid 540 to be a polishing liquid onto the polishing pad 525 on the upstream side of the substrate 300 from obliquely above so that the polishing liquid has a velocity component in the diameter direction in Cu-CMP. Similarly, the chemical fluid 540 to be a cleaning liquid is supplied onto the polishing pad 525 on the upstream side of the substrate 300 from obliquely above so that the cleaning liquid has a velocity component in the diameter direction in re-polishing for cleaning. As a consequence, the flow rate of the chemical fluid 540 to be a cleaning liquid can be reduced.

Second Embodiment

The first embodiment has been described by focusing on a step in which wiring is formed using Cu, which is an example of a conductive material, in a process of manufacturing a semiconductor device, but the step in which a substrate is polished in the process of manufacturing a semiconductor device is not limited to this. A second embodiment will be described by focusing on an oxide film CMP in a process in which a plug connecting a device part and a wiring part is formed as an example of the oxide film CMP in the process of manufacturing a semiconductor device.

Figure 8:
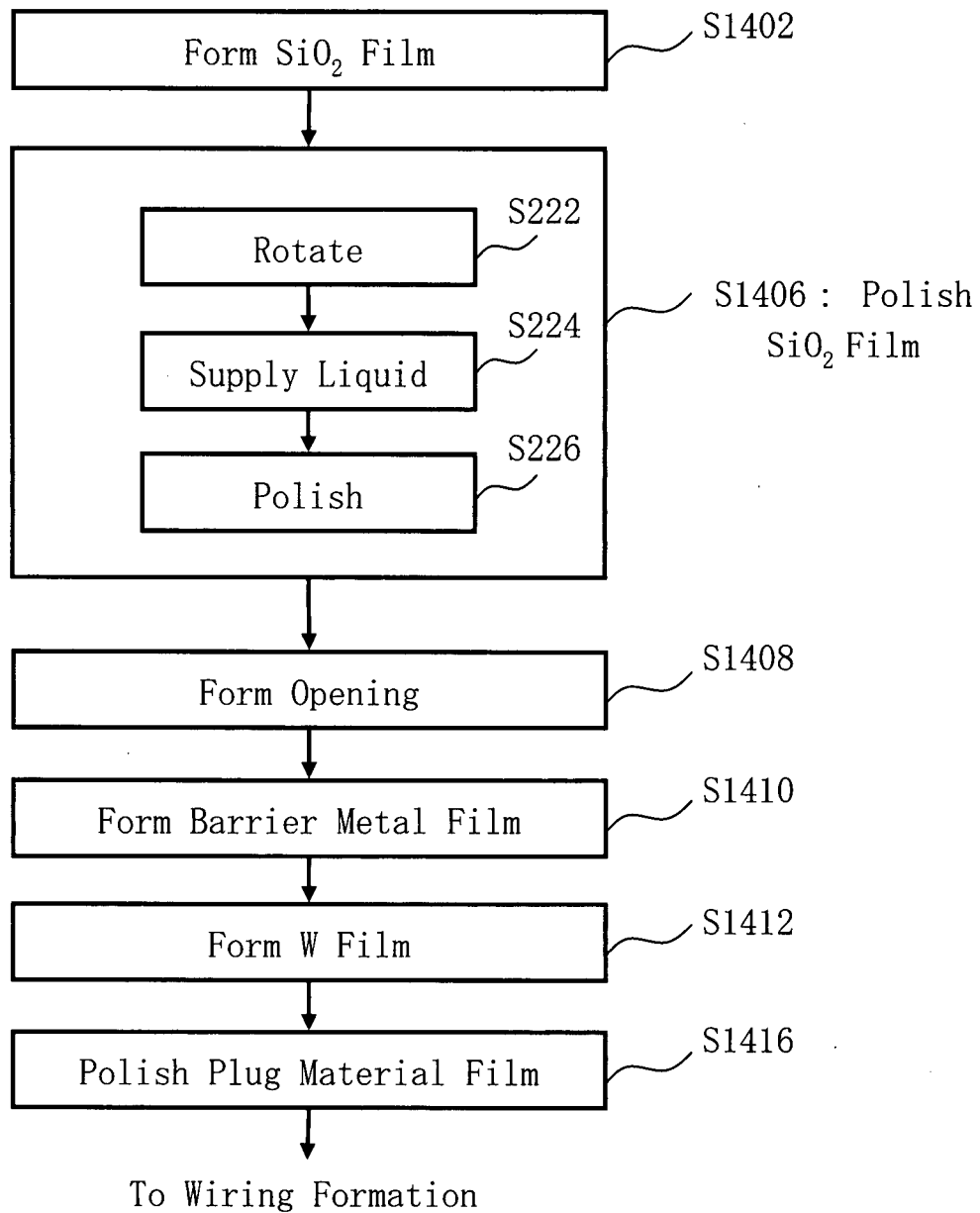
FIG. 8 is a flowchart showing principal parts of a method of manufacturing a semiconductor device in a second embodiment.

The second embodiment will be described below with reference to the drawings. FIG. 8 is a flowchart showing principal parts of a method of manufacturing a semiconductor device in the second embodiment. In FIG. 8, in the second embodiment, a series of steps are performed. The series of steps include an $SiO_2$ film formation step (S1402) in which a thin film of $SiO_2$ film is formed, an $SiO_2$ film polishing step (S1406) in which the thin film of $SiO_2$ film is polished, an opening formation step (S1408) in which an opening is formed, a barrier metal film formation step (S1410), a W film formation step (S1412) in which a thin film of W film is formed, and a plug material film polishing step (S1416) in which the barrier metal film and W film are polished. Then, a series of steps including a rotation step (S222), a liquid supply step (S224), and a polishing step (S226) are performed as internal steps of the SiO$_2$ film polishing step (S1406).

Figure 9A:
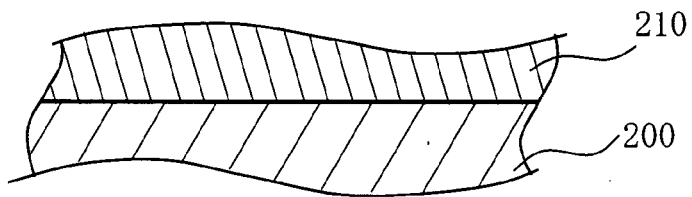
FIGS. 9A to 9C are process sectional views showing steps performed in accordance with the flowchart in FIG. 8.
Figure 9B:
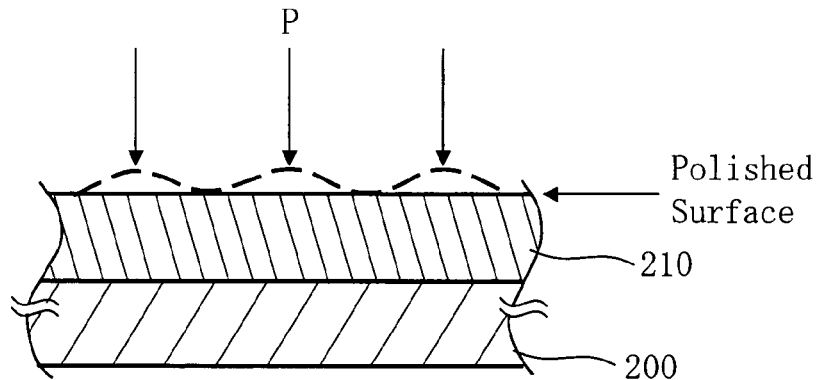
Figure 9C:
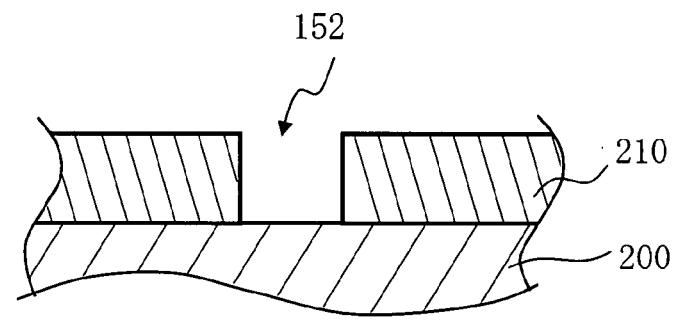

FIGS. 9A to 9C are process sectional views showing steps performed in accordance with the flowchart in FIG. 8. FIGS. 9A to 9C show from the SiO$_2$ film formation step (S1402) to the opening formation step (S1408) in FIG. 8. Steps thereafter will be described later.

In FIG. 9A, as the SiO$_2$ film formation step, a thin film of SiO$_2$ film whose thickness is, for example, 500 nm is deposited by the CVD method on the surface of the substrate 200 where a device part is formed to form an SiO$_2$ film 210 to be a dielectric film in a plug layer. The film is formed here by the CVD method, but any other method may be used. Here, the surface of the substrate 200 before deposition is preferably flat when depositing a thin film of the SiO$_2$ film 210. However, if the surface of the substrate 200 is wavy due to, for example, gate formation, the surface of the deposited SiO$_2$ film 210 will also be wavy. Thus, it is preferable to perform polishing also here to flatten the surface of the SiO$_2$ film 210.

In FIG. 9B, as the SiO$_2$ film polishing step, the thin film of the SiO$_2$ film 210 formed on the surface of the substrate 200 is polished. Flattening the SiO$_2$ film 210 makes it possible to prevent barrier metal or W caused to deposit in a step described later from remaining in a crevice at a position different from a desired position. Here, the device configuration may be the same as that of the CMP device shown in FIGS. 5 to 7. Then, the substrate 300 whose surface to be polished is directed downward is held by the carrier 510 on the polishing pad 525 arranged on the turn table 520.

In S222, as the rotation step, the substrate 300 is caused to rotate by rotating the carrier 510, and thereby rotating also the turn table 520. By causing the turn table 520 to rotate, the polishing pad 525 is caused to rotate together.

In S224, as the liquid supply step, the chemical fluid 540 to be a polishing liquid is supplied from the supply nozzle 530 so that the chemical fluid 540 comes into contact with the surface of the polishing pad 525 from substantially an oblique direction with respect to the surface of the rotating polishing pad 525. Here, like the first embodiment, the chemical fluid 540 to be a polishing liquid is supplied at an angle of θ to the surface of the polishing pad 525, as shown in FIGS. 5 and 7. Also, as shown in FIGS. 5 and 6, the chemical fluid 540 to be a polishing liquid is supplied moving from the substantial center of the polishing pad 525 toward the outer side when supplying the chemical fluid 540. Then, the chemical fluid 540 to be a polishing liquid is supplied to the fore side of the substrate 300 (upstream side of the substrate 300) positioned in the rotation direction of the turn table 520 shown by the angle φ. In this manner, the chemical fluid 540 to be a polishing liquid is supplied in such a way that the chemical fluid 540 comes into contact with the surface of the polishing pad 525 from an oblique direction upstream of the substrate 300 while moving from the substantial center of the polishing pad 525 toward the outer side of the polishing pad 525. As a consequence, the chemical fluid 540 to be a polishing liquid can be made to hold a velocity component in the diameter direction of the polishing pad 525.

In S226, as the polishing step, the surface of the substrate 300 is polished by pressing the surface of the substrate 300 against the polishing pad 525 using the carrier 510 while supplying the chemical fluid 540 to be a polishing liquid having the velocity component in the diameter direction of the polishing pad 525.

Here, polishing conditions were: $3.92 \times 10^4$ Pa (400 gf/cm$^2$) of the polishing load P, 105 min$^{-1}$ (rpm) of the rotational speed of the carrier 510, and 100 min$^{-1}$ (rpm) of the rotational speed of the turn table 520, and IC1000 (manufactured by RODEL) was used as the polishing pad 525.

Then, slurry containing ceria (5 wt %) as abrasive particles was used as the chemical fluid 540 to be a polishing liquid used for SiO$_2$ film 210 polishing (for oxide film-CMP). Here, a process in which two liquids were mixed on a table was used and 0.003 L/min (3 ml/min) of a solution of polyoxyethylene alkyl ether (0.05 wt %) was simultaneously supplied separately from a second supply nozzle (not shown) as a surfactant.

Here, when a polishing liquid was supplied with the supply port of the supply nozzle 530 directed from the inner side toward the outer side of the polishing pad 525, polishing was performed under a plurality of conditions. As parameters used were the flow rate and flow velocity of the polishing liquid, the angle φ of the supply port of the supply nozzle 530 with respect to the center of the substrate 300 when the center of the turn table 520 in the polishing pad 525 plane (xy plane) was defined as the center, and the angle θ of the supply port of the supply nozzle 530 with respect to the polishing pad 525 plane in a direction (z direction) perpendicular to the polishing pad 525 plane. Then, the polishing rate, amount of dishing, and polishing temperature under each condition were compared. Under any condition, the liquid contact position of the polishing liquid with the polishing pad 525 was configured to be the substantial rotation center position of the polishing pad 525. This liquid contact position is preferably on the side of the rotation center position of the polishing pad 525 rather than at an end of the substrate 300.

As a conventional example 3.0, the supply nozzle 530 was arranged at the substantial center position (substantial rotation center position of the polishing pad 525) of the turn table 520 directed toward right below (θ=90 degrees). Then, a polishing liquid (slurry) containing ceria (5 wt %) to be the chemical fluid 540 with the flow rate of 0.3 L/min (300 ml/min) and the flow velocity at that time of 0.3 m/sec (30 cm/sec) at the supply port of the supply nozzle 530 was supplied from the supply nozzle 530 onto the polishing pad 525 plane.

As a sample 3.0, the supply nozzle 530 was arranged at the substantial center position (substantial rotation center position of the polishing pad 525) of the turn table 520 directed toward right below (θ=90 degrees). Then, a polishing liquid (slurry) containing ceria (5 wt %) to be the chemical fluid 540 with the flow rate of 0.15 L/min (150 ml/min) and the flow velocity at that time of 0.15 m/sec (15 cm/sec) at the supply port of the supply nozzle 530 was supplied from the supply nozzle 530 onto the polishing pad 525 plane.

As a sample 3.1, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.15 m/sec (15 cm/sec) at the supply port of the supply nozzle 530 was supplied from the supply nozzle 530 onto the polishing pad 525 plane.

As a sample 3.2, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.2 m/sec (20 cm/sec) at the supply port of the supply nozzle 530 was supplied from the supply nozzle 530 onto the polishing pad 525 plane.

As a sample 3.3, the supply nozzle 530 was arranged at the substantial center position (substantial rotation center position of the polishing pad 525) of the turn table 520 at angles of φ=90 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.25 m/sec (25 cm/sec) at the supply port of the supply nozzle 530 was supplied from the supply nozzle 530 onto the polishing pad 525 plane.

As a sample 3.4, the supply nozzles 30 was arranged at the substantial center position (substantial rotation center position of the polishing pad 525) of the turn table 520 at angles of φ=90 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.30 m/sec (30 cm/sec) at the supply port of the supply nozzle 530 was supplied from the supply nozzle 530 onto the polishing pad 525 plane.

As a sample 3.5, the supply nozzle 530 was arranged at the substantial center position (substantial rotation center position of the polishing pad 525) of the turn table 520 at angles of φ=90 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.6, the supply nozzle 530 was arranged at the substantial center position (substantial rotation center position of the polishing pad 525) of the turn table 520 at angles of φ=90 degrees and θ=25 degrees with the supply port of the supply nozzle 530 directed toward the outer side of the polishing pads 25. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.7, the supply nozzle 530 was arranged at the substantial center position (substantial rotation center position of the polishing pad 525) of the turn table 520 at angles of φ=90 degrees and θ=45 degrees with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.8, the supply nozzle 530 was arranged at the substantial center position (substantial rotation center position of the polishing pad 525) of the turn table 520 at angles of φ=90 degrees and θ=60 degrees with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.9, the supply nozzle 530 was arranged at the substantial center position (substantial rotation center position of the polishing pad 525) of the turn table 520 at angles of φ=90 degrees and θ=75 degrees with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.10, the supply nozzle 530 was arranged at the substantial center position (substantial rotation center position of the polishing pad 525) of the turn table 520 directed toward right below (θ=90 degrees). Then, a polishing liquid (slurry) containing ceria (5 wt %) to be the chemical fluid 540 with the flow rate of 0.15 L/min (150 ml/min) and the flow velocity at that time of 0.35 m/sec (35 cm/sec) at the supply port of the supply nozzle 530 was supplied from the supply nozzle 530 onto the polishing pad 525 plane.

As a sample 3.11, the supply nozzle 530 was arranged at the substantial center position (substantial rotation center position of the polishing pad 525) of the turntable 520 at angles of φ=135 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

As a sample 3.12, the supply nozzle 530 was arranged at the substantial center position (substantial rotation center position of the polishing pad 525) of the turntable 520 at angles of φ=270 degrees and θ=0 degree with the supply port of the supply nozzle 530 directed toward the outer side of the polishing pad 525. Then, a polishing liquid (slurry) containing ceria (5 wt %) to be the chemical fluid 540 with the flow rate of 0.15 L/min (150 ml/min) and the flow velocity of 0.35 m/sec (35 cm/sec) at the supply port of the supply nozzle 530 was supplied from the supply nozzle 530 onto the polishing pad 525 plane.

Table 3 below shows polishing results under the above conditions.

TABLE 3

|  | Slurry Flow Rate ml/min | Flow Velocity cm/sec | Direction (X, Y) Degree | Direction (Z) Degree | Polishing Rate nm/min | Dishing nm | Temp. deg. | Determination |
|---|---|---|---|---|---|---|---|---|
| Conventional Example 3.0 | 300 | 30 | — | 90 | 400 | 20 | 50 | GOOD |
| Sample 3.0 | 150 | 15 | — | 90 | 300 | 80 | 60 | NG |

TABLE 3-continued

| | Slurry Flow Rate ml/min | Flow Velocity cm/sec | Direction (X, Y) Degree | Direction (Z) Degree | Polishing Rate nm/min | Dishing nm | Temp. deg. | Determination |
|---|---|---|---|---|---|---|---|---|
| Flow Velocity | | | | | | | | |
| Sample 3.1 | 150 | 15 | 90 | 0 | 320 | 32 | 56 | NG |
| Sample 3.2 | 150 | 20 | 90 | 0 | 380 | 28 | 53 | GOOD |
| Sample 3.3 | 150 | 25 | 90 | 0 | 430 | 25 | 50 | GOOD |
| Sample 3.4 | 150 | 30 | 90 | 0 | 480 | 20 | 48 | BETTER |
| Sample 3.5 | 150 | 35 | 90 | 0 | 500 | 23 | 48 | BETTER |
| Z | | | | | | | | |
| Sample 3.6 | 150 | 35 | 90 | 25 | 470 | 18 | 48 | BETTER |
| Sample 3.7 | 150 | 35 | 90 | 45 | 445 | 20 | 48 | GOOD |
| Sample 3.8 | 150 | 35 | 90 | 60 | 415 | 25 | 52 | GOOD |
| Sample 3.9 | 150 | 35 | 90 | 75 | 400 | 28 | 55 | GOOD |
| Sample 3.10 | 150 | 35 | — | 90 | 330 | 35 | 58 | NG |
| XY | | | | | | | | |
| Sample 3.11 | 150 | 35 | 135 | 0 | 410 | 25 | 52 | GOOD |
| Sample 3.12 | 150 | 35 | 270 | 0 | 305 | 40 | 60 | NG |

Criteria were defined as follows: Samples whose polishing rate was slower than 350 nm/min or whose dishing amount exceeded 30 nm were determined to be "NG". Samples whose polishing rate was 350 nm/min or more and less than 450 nm/min and whose dishing amount was 30 nm or less were determined to be "GOOD". Then, samples whose polishing rate was 450 nm/min or more and whose dishing amount was 30 nm or less were determined to be "BETTER".

Here, like the first embodiment, the flow velocity was measured using an ultrasonic flowmeter. The amount of the change is calculated to display a flow velocity. The flow velocity was also adjusted by changing the piping radius of the supply nozzle 530.

In Table 3, the conventional example 3.0 represents the current condition, under which the polishing rate was 400 nm/min, the amount of oxide film dishing was 20 nm, and the temperature during polishing was steadily 50 degrees or below. In the sample 3.0, on the other hand, which is a case in which the flow rate of slurry is simply reduced from the current condition, the polishing rate was 300 nm/min, the amount of oxide film dishing was 80 nm, and the temperature during polishing reached 60 degrees, leading to unstable polishing. This result shows that simply reducing the flow rate of slurry does not meet process performance. Then, in the samples 3.1 to 3.5, effects of the flow velocity were checked by increasing the flow velocity with the angle φ=90 degrees and the angle θ=0 degree while the flow rate is reduced by half. Next, in the samples 3.5 to 3.10, the angle θ was increased from the condition of the sample 3.5 to check effects of the angle θ. Further, in the samples 3.5, 3.11, and 3.12, the angle φ was increased from the condition of the sample 3.5 to check effects of the angle φ.

From the above results, the supply method shown in the sample 3.5 was found to be most effective. That is, the flow velocity was increased to 0.35 m/min (35 cm/min), and the supply nozzle 530 was set to be φ=90 degrees upstream with respect to the center direction of the substrate 300 and directed in parallel (θ=0 degree) with the polishing pad 525. By adopting such conditions, the polishing rate reached 540 nm/min, which is faster than before reducing the flow rate, the amount of oxide film dishing was small with 23 nm, and the temperature during polishing could be stabilized at 48° C. or below. Also, the results of the samples 3.1 to 3.5 show that much effect can be obtained by increasing the flow velocity. Then, by increasing the flow velocity up to 0.25 m/sec (25 cm/sec), characteristics exceeding those before reducing the flow rate of the polishing liquid by half can be obtained. That is, increasing the flow velocity produces a better result. Considering that such performance can be obtained even if the flow rate of the polishing liquid is reduced by half, it is apparent how wasteful conventional supply methods have been. Next, as the results of the samples 3.5, 3.11 and 3.12 show that, while the angle φ=90 degrees is "BETTER" and the angle φ=135 degrees is "GOOD", the angle φ=270 degrees is "NG". This shows that supplying the polishing liquid directed toward the upstream side of the substrate 300 is effective. That is, if supplied in a direction exceeding the angle φ of 180 degrees and directed toward the angle φ of 270 degrees with respect to the center of the substrate 300 like the sample 3.12, it is evident that there is little effect even if the flow velocity is increased. Then, the results of the samples 3.5 to 3.10 show that, from a standpoint of bringing the polishing liquid into contact with the surface of the polishing pad 525 reliably from an oblique direction with respect to the surface of the polishing pad 525, the angle θ is preferably close to 0, but good enough when the angle θ is 75 degrees or less. Dependence on the angle θ at which the polishing liquid jumps (direction in which the polishing liquid is supplied) is small. However, if the angle θ is 90 degrees, like the sample 3.10, there is no effect at all even if the flow velocity is increased. This suggests that it is important to supply a polishing liquid to the upstream side of the substrate 300 by making the polishing liquid hold a velocity component in the substrate plane direction and a minimum jumping angle is required for this purpose.

Based on the above results and further, after trials and errors by the inventors, the following ranges were found to be suitable like the first embodiment. It is suitable if the discharge angle φ in the xy direction of the chemical fluid 540 to be a polishing liquid discharged from the supply nozzle 530 is set between 45 degrees and 180 degrees toward the upstream direction of the rotation direction of the polishing pad 525 with respect to the center of the substrate 300. Also, it is suitable if the angle θ in the z direction of the chemical fluid 540 to be a polishing liquid discharged from the supply nozzle 530 is set between 0 degree and 60 degrees with respect to the polishing pad 525 plane. Then, it is suitable if the flow velocity of the supplied chemical fluid 540 to be a polishing liquid is supplied at 0.2 m/sec (20 cm/sec) or more and 1 m/sec (100 cm/sec) or less. With the above settings, the amount of supply of the chemical fluid 540 to be a polishing liquid, which conventionally requires 0.3 L/min (300 ml/min), can be reduced to 0.05 L/min (50 ml/min) to 0.2 L/min (200 ml/min) without deteriorating process performance.

In a conventional CMP device, a polishing liquid serving as a basis is supplied from above in a direction substantially perpendicular to the surface of the polishing pad 525. In other words, even if the supply nozzle is not right below and a little slanted, the polishing liquid is dropped in a substantially vertical direction and comes into contact with the surface to be polished from the vertical direction. Thus, the polishing liquid supplied to the surface of the polishing pad 525 just spreads to the outer side of the polishing pad 525 due to a centrifugal force resulting from rotation of the turn table 520. Consequently, to supply a sufficient amount of the polishing liquid required for polishing the substrate 300 to the surface to be polished, a large flow rate is needed at the conventional rotational speed of the turn table 520. If, for example, the flow rate of the polishing liquid that conventionally requires the flow rate of 0.3 L/min (300 ml/min) is reduced by half to 0.15 L/min (150 ml/min), as described above, a rise in polishing temperature, reduced polishing rate, and deterioration in flattening were caused. In contrast, in the present embodiment, by slanting the supply nozzle 530 to make the chemical fluid 540 to be a polishing liquid hold a velocity component in the diameter direction of the polishing pad 525, movement of the polishing liquid in the diameter direction due to a centrifugal force resulting from rotation of the turn table 520 is compensated so that a sufficient amount of polishing liquid can be supplied to the surface to be polished by a flow rate smaller than a conventional one.

Here, the polishing liquid for oxide film-CMP described above can use, in addition to ceria as abrasive particles, colloidal silica, fumed silica, colloidal alumina, fumed alumina, titania, organic particles, or composite particles in which organic and inorganic particles are integrated.

Examples of a surfactant used in a second liquid supplied separately include potassium dodecylbenzenesulfonate, ammonium dodecylbenzenesulfonate, polyacrylic acid, potassium polyacrylate, ammonium polyacrylate, polyvinyl pyrrolidone, and an acetylene glycol nonionic surfactant.

In FIG. 9C, as the opening formation step, an opening 152, which is a plug hole structure for preparing a plug in the lithography step and dry etching step, is formed inside the $SiO_2$ film 210. The opening 152 may be formed by removing the exposed $SiO_2$ film 210 using the anisotropic etching method of the substrate 200 on which a resist film is formed on the $SiO_2$ film 210 through the lithography step such as a resist application step and exposure step (not shown). By using the anisotropic etching method, the opening 152 can be formed in a direction substantially perpendicular to the surface of the substrate 200. For example, the opening 152 may be formed by a reactive ions etching method.

Figure 10A:
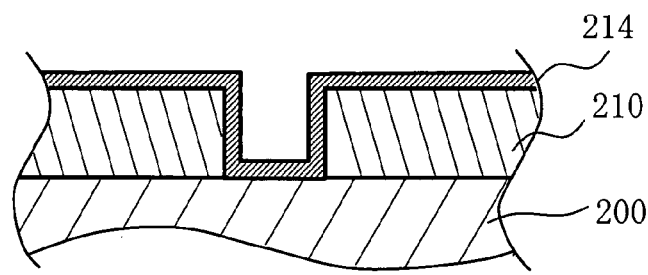
FIGS. 10A to 10C are process sectional views showing steps performed in accordance with the flowchart in FIG. 8.
Figure 10B:
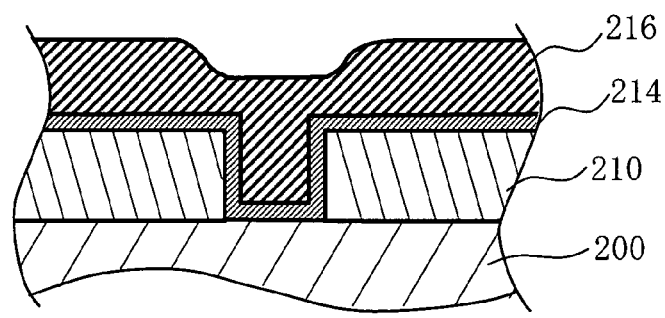
Figure 10C:
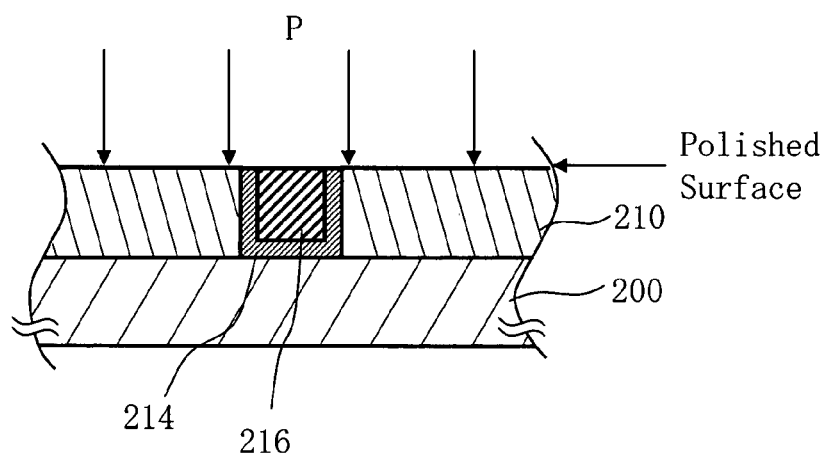

FIGS. 10A to 10C are process sectional views showing steps performed in accordance with the flowchart in FIG. 8. FIGS. 10A to 10C show from the barrier metal film formation step (S1410) to the plug material film polishing step (S1416) in FIG. 8.

In FIG. 10A, as the barrier metal film formation step, a titanium nitride (TiN) film 214 to be a barrier metal film using barrier metal material is formed inside the opening 152 and on the surface of the $SiO_2$ film 210 formed by the above opening formation step. A thin film of the TiN film 214 is formed inside a sputtering device using the sputtering process, which is one of the physical vapor deposition (PVD) methods. The method of depositing the barrier metal material is not limited to the PVD method, and also the ALD method, ALCVD method, and CVD method may also be used. Coverage can thereby be increased when compared with the PVD method.

In FIG. 10B, as the W film formation step, a thin film of a W film 216 is caused to deposit (form) on the inner wall of the opening 152 and the surface of the substrate 200, where the TiN film 214 is formed, by the CVD method.

In FIG. 10C, as the plug material film polishing step, the surface of the substrate 200 is polished to remove the W film 216 and TiN film 214 deposited on the surface of the $SiO_2$ film 210 excluding the opening 152 to form a plug as shown in FIG. 10C. Here, the device configuration may be the same as the CMP device shown in FIGS. 5 to 7, and therefore a description thereof is omitted. Polishing conditions may be adjusted to those for polishing the W film 216 and TiN film 214 when appropriate.

Figure 11:
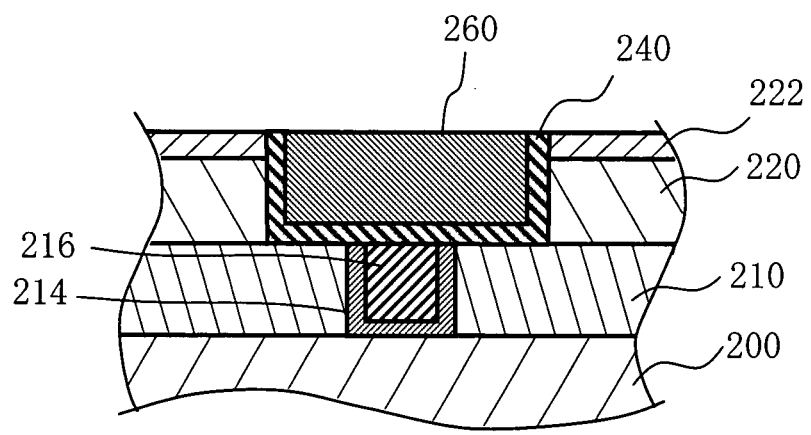
FIG. 11 is a sectional view showing a wiring layer formed on a plug layer.

FIG. 11 is a sectional view showing a wiring layer formed on a plug layer. After forming a plug as shown in FIG. 10C, wiring as shown in FIG. 11 may be formed.

As described above, also in oxide film-CMP, the flow rate of the polishing liquid can be reduced by supplying a polishing liquid onto the polishing pad 525 to the upstream side of the substrate 300 from obliquely above so that the polishing liquid has a velocity component in the diameter direction.

Third Embodiment

In the first and second embodiments described above, the chemical fluid 540 was supplied moving from the substantial center of the polishing pad 525 toward the outer side when supplying the chemical fluid 540 in a CMP device, but these embodiments are not limited to this. In a third embodiment, a configuration of supplying the chemical fluid 540 from the outer side of the polishing pad 525 toward the substantial center of the polishing pad 525 when supplying the chemical fluid 540 will be described. In the third embodiment, particularly the Cu-CMP will be described. The flowchart showing principal parts of a method of manufacturing a semiconductor device in the third embodiment and process sectional views showing steps performed in accordance with the flowchart are the same as those in the first embodiment.

S102 to S114 are the same as those in the first embodiment, and therefore, a description thereof will be omitted. In FIG. 4, as the conductive material film polishing step (S116), the surface of the substrate 200 is polished by the CMP process to remove the Cu film 260 and barrier metal film 240 including the seed film 250 to be a wiring layer as a conductive part deposited on the surface excluding the opening before being flattened as shown in FIG. 4. Internal steps of the conductive material film polishing step to be a method of polishing a conductive material film will be described below.

Figure 12:
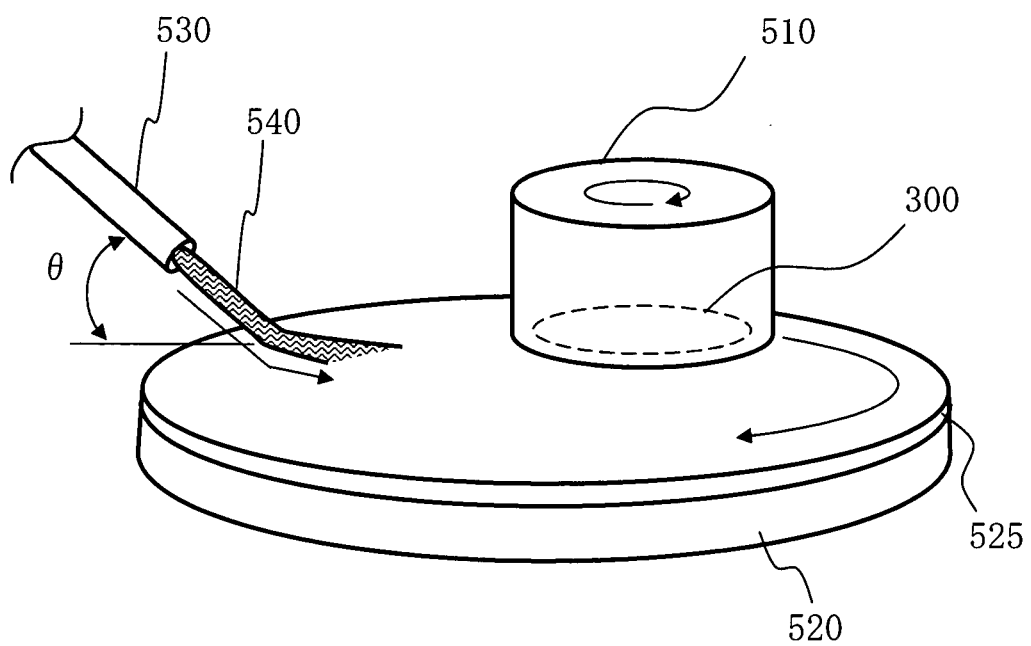
FIG. 12 is a conceptual diagram showing a configuration of a CMP device in a third embodiment.
Figure 13:
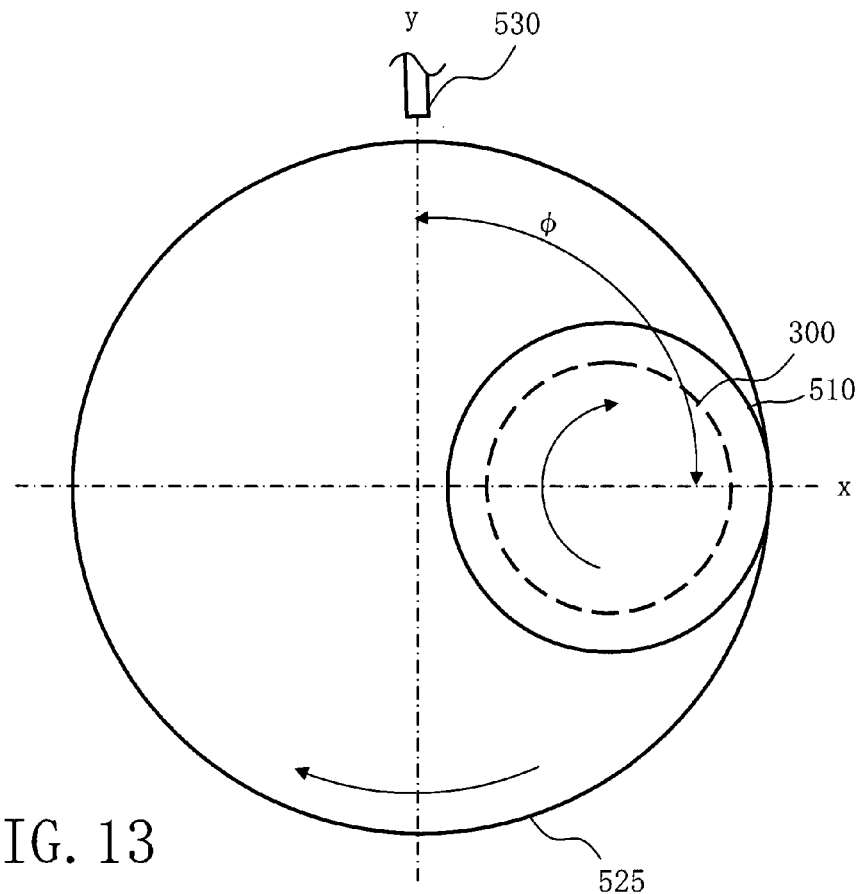
FIG. 13 is a conceptual diagram illustrating an operation of the CMP device when the CMP device in FIG. 12 is viewed from a top surface.
Figure 14:
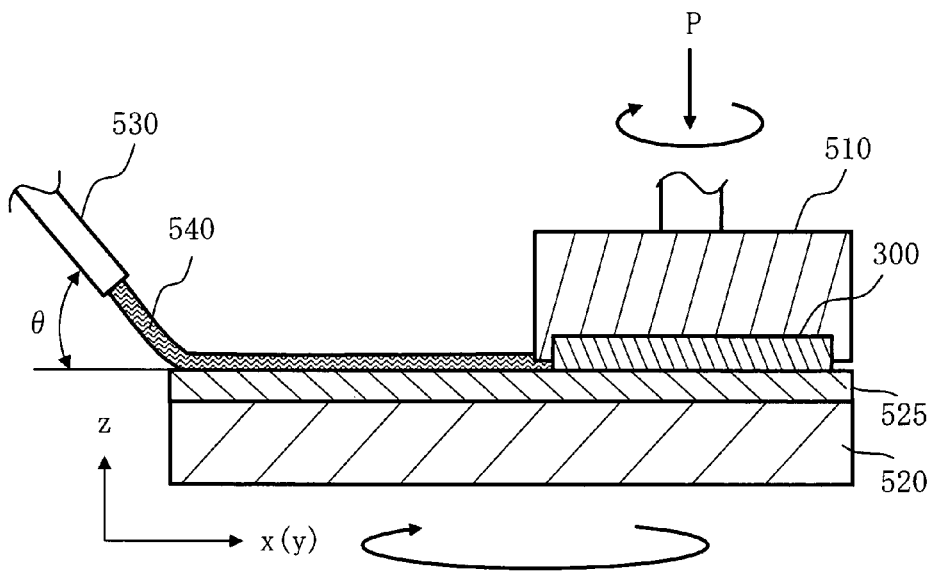
FIG. 14 is a conceptual diagram showing a sectional configuration of the CMP device shown in FIG. 12.

FIG. 12 is a conceptual diagram showing a configuration of a CMP device in the third embodiment. FIG. 13 is a conceptual diagram illustrating an operation of the CMP device when the CMP device in FIG. 12 is viewed from a top surface. FIG. 14 is a conceptual diagram showing a sectional configuration of the CMP device shown in FIG. 12. In FIGS. 12 to 14, in a rotary CMP device to be an example of the polishing machine, the substrate 300 whose surface to be polished is directed downward is held by the carrier 510 on the polishing pad 525 arranged on the turn table 520.

In S202, as the rotation step, the substrate 300 is caused to rotate by rotating the carrier 510, and thereby rotating also the turn table 520. By causing the turn table 520 to rotate, the polishing pad 525 is caused to rotate together.

In S204, as the liquid supply step, the chemical fluid 540 to be a polishing liquid is supplied from the supply nozzle 530 so that the chemical fluid 540 comes into contact with the surface of the polishing pad 525 from substantially an oblique direction with respect to the surface of the rotating polishing pad 525. Here, in the third embodiment, the chemical fluid 540 to be a polishing liquid is supplied at an angle of θ to the surface of the polishing pad 525, as shown in FIGS. 12 and 14. Also, as shown in FIGS. 12 and 13, the chemical fluid 540 to be a polishing liquid is supplied moving from the outer side of the polishing pad 525 toward the substantial center of the polishing pad 525 when supplying the chemical fluid 540. Then, the chemical fluid 540 to be a polishing liquid is supplied to the fore side of the substrate 300 (upstream side of the substrate 300) positioned in the rotation direction of the turn table 520 shown by the angle φ. In this manner, the chemical fluid 540 to be a polishing liquid is supplied in such a way that the chemical fluid 540 comes into contact with the surface of the polishing pad 525 from obliquely above upstream of the substrate 300 while moving from the outer side of the polishing pad 525 toward the substantial center of the polishing pad 525. As a consequence, the chemical fluid 540 to be a polishing liquid can be made to hold a velocity component in the diameter direction of the polishing pad 525.

In S206, as the polishing step, the surface of the substrate 300 is polished by pressing the surface of the substrate 300 against the polishing pad 525 using the carrier 510 while supplying the chemical fluid 540 to be a polishing liquid having the velocity component in the diameter direction of the polishing pad 525.

Here, polishing conditions are: $0.98 \times 10^4$ Pa (100 gf/cm$^2$) of the polishing load P, 183 min$^{-1}$ (rpm) of the rotational speed of the carrier 510, and 150 min$^{-1}$ (rpm) of the rotational speed of the turn table 520, and IC1000 (manufactured by RODEL) is used as the polishing pad 525. Polishing was performed until the Cu film 260 including the seed film 250 was all cleared and additionally 30% to provide over-polish. The polishing conditions are the same as those in the first embodiment excluding those of the rotational speeds of the turn table 520 and carrier 510 and the polishing load P. The polishing liquid used for Cu film 260 polishing (for Cu-CMP) is also the same as that in the first embodiment. When compared with the first embodiment, as described above, the load and rotational speed are basically reduced in the third embodiment, which makes it possible to suppress scratch and film peeling. Assume that the polishing liquid (slurry) to be the chemical fluid 540 is supplied at the substantial center position (substantial rotation center position of the polishing pad 525) of the conventional turn table 520 directed toward right below (θ=90 degrees) with the flow rate of 0.3 L/min (30 cm/min) and the flow velocity of 0.3 m/sec (30 cm/sec) at this rotational speed. In this case, almost all the polishing liquid will be driven out of the table before reaching the substrate 300 due to a centrifugal force. Thus, the polishing rate in a central part of a wafer will be slow, as described later. Therefore, in-plane evenness will be 30% in 3σ, for example, leading to marked deterioration when compared with results of the rotational speed in the first embodiment. Consequently, the direction, flow velocity and the like of the polishing liquid will be configured in the third embodiment to comply with high-speed rotation, as described later.

Here, polishing was performed under a plurality of conditions. In this case, as parameters used were the flow rate and flow velocity of the polishing liquid, the angle φ of the supply port of the supply nozzle 530 with respect to the center of the substrate 300 when the center of the turn table 520 in the polishing pad 525 plane (xy plane) was defined as the center, and the angle θ of the supply port of the supply nozzle 530 with respect to the polishing pad 525 plane in a direction (z direction) perpendicular to the polishing pad 525 plane. Then, the polishing rate, amount of dishing, and in-plane evenness under each condition were compared. Here, also the turn table 520 whose radius of rotation was 370 mm was used. Similarly, the polishing pad 525 whose radius of rotation is 370 mm was arranged on the turn table 520. Then, as shown in FIG. 13, the turn table 520 was rotated clockwise (right-hand turning) when viewed from above. Under conditions described below, as shown in FIG. 13, a position is determined in an xy coordinate system in which the rotation center position of the turn table 520 is defined as an origin.

As a conventional example 4.0, the supply nozzle 530 was arranged at the substantial center position (substantial rotation center position of the polishing pad 525) of the turn table 520 directed toward right below (θ=90 degrees). Then, a polishing liquid (slurry) to be the chemical fluid 540 with the flow rate of 0.3 L/min (300 ml/min) and the flow velocity at that time of 0.3 m/sec (30 cm/sec) at the supply port of the supply nozzle 530 was supplied from the supply nozzle 530 onto the polishing pad 525 plane.

As a sample 4.1, the supply nozzle 530 was arranged at the substantial center position (substantial rotation center position of the polishing pad 525) of the turn table 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.15 m/sec (15 cm/sec) at the supply port of the supply nozzle 530 was supplied from the supply nozzle 530 onto the polishing pad 525 plane.

As a sample 4.2, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.2 m/sec (20 cm/sec) at the supply port of the supply nozzle 530 was supplied from the supply nozzle 530 onto the polishing pad 525 plane.

As a sample 4.3, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.25 m/sec (25 cm/sec) at the supply port of the supply nozzle 530 was supplied from the supply nozzle 530 onto the polishing pad 525 plane.

As a sample 4.4, the supply nozzle 530 was arranged at the substantial center position (substantial rotation center position of the polishing pad 525) of the turntable 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.30 m/sec (30 cm/sec) at the supply port of the supply nozzle 530 was supplied from the supply nozzle 530 onto the polishing pad 525 plane.

As a sample 4.5, the supply nozzle 530 was arranged at the substantial center position (substantial rotation center position of the polishing pad 525) of the turn table 520 at angles of φ=90 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.6, the supply nozzle 530 was arranged at the substantial center position (substantial rotation center position of the polishing pad 525) of the turn table 520 at angles of φ=90 degrees and θ=25 degrees with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.7, the supply nozzle 530 was arranged at the substantial center position (substantial rotation center position of the polishing pad 525) of the turn table 520 at angles of φ=90 degrees and θ=45 degrees with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.8, the supply nozzle 530 was arranged at the substantial center position (substantial rotation center position of the polishing pad 525) of the turn table 520 at angles of φ=90 degrees and θ=60 degrees with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.9, the supply nozzle 530 was arranged at the substantial center position (substantial rotation center position of the polishing pad 525) of the turn table 520 at angles of φ=90 degrees and θ=75 degrees with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.10, the supply nozzle 530 was arranged at the substantial center position (substantial rotation center position of the polishing pad 525) of the turn table 520 directed toward right below (θ=90 degrees). Then, a polishing liquid (slurry) to be the chemical fluid 540 with the flow rate of 0.3 L/min (300 ml/min) and the flow velocity at that time of 0.35 m/sec (35 cm/sec) at the supply port of the supply nozzle 530 was supplied from the supply nozzle 530 onto the polishing pad 525 plane.

As a sample 4.11, the supply nozzle 530 was arranged at the substantial center position (substantial rotation center position of the polishing pad 525) of the turn table 520 at angles of φ=135 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.12, the supply nozzle 530 was arranged at the substantial center position (substantial rotation center position of the polishing pad 525) of the turntable 520 at angles of φ=270 degrees and θ=0 degree with the supply port of the supply nozzle 530 directed toward the outer side of the polishing pad 525. Then, a polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

Under any of the conditions of the conventional example 4.0 and samples 4.1 to 4.12, the liquid contact position of the polishing liquid with the polishing pad 525 was configured to be the substantial rotation center position of the polishing pad 525. However, under conditions below, the supply nozzle 530 is arranged with the supply port directed toward the inner side of the polishing pad 525 so that the polishing liquid is supplied moving from the outer side to the inner side of the polishing pad 525. For this reason, the position where the polishing liquid comes into contact with the polishing pad 525 is also varied.

As a sample 4.13, the supply nozzle 530 was arranged at a position near xy coordinates (0, 180) shown in FIG. 13 on the polishing pad 525 plane where a polishing liquid came into contact with the polishing pad 525 at angles of φ=90 degrees and θ=0 degree with the supply port of the supply nozzle 530 directed toward the center side of the polishing pad 525. Then, the polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.14, the supply nozzle 530 was arranged at a position near xy coordinates (0, 330) shown in FIG. 13 on the polishing pad 525 plane where a polishing liquid came into contact with the polishing pad 525 at angles of φ=90 degrees and θ=0 degree with the supply port of the supply nozzle 530 directed toward the center side of the polishing pad 525. Then, the polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.15, the supply nozzle 530 was arranged at a position near xy coordinates (−250, 250) shown in FIG. 13 on the polishing pad 525 plane where a polishing liquid came into contact with the polishing pad 525 at angles of φ=135 degrees and θ=0 degree with the supply port of the supply nozzle 530 directed toward the center side of the polishing pad 525. Then, the polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

As a sample 4.16, the supply nozzle 530 was arranged at a position near xy coordinates (−330, 0) shown in FIG. 13 on the polishing pad 525 plane where a polishing liquid came into contact with the polishing pad 525 at angles of φ=180 degrees and θ=0 degree with the supply port of the supply nozzle 530 directed toward the center side of the polishing pad 525. Then, the polishing liquid (slurry) to be the chemical fluid 540 with the flow rate of 0.3 L/min (300 ml/min) and the flow velocity of 0.35 m/sec (35 cm/sec) at the supply port of the supply nozzle 530 was supplied from the supply nozzle 530 onto the polishing pad 525 plane.

TABLE 4 below shows results under the above conditions.

TABLE 4

| | Slurry Flow Rate ml/min | Flow Velocity cm/sec | Direction (X, Y) Degree | Direction (Z) Degree | Liquid Contact Position X, Y mm | Polishing Rate nm/min | Dishing nm | In-plane Evenness % | Determination |
|---|---|---|---|---|---|---|---|---|---|
| Conventional Example 4.0 Flow Velocity | 300 | 30 | — | 90 | 0, 0 | 1100 | 60 | 30 | NG |
| Sample 4.1 | 300 | 15 | 90 | 0 | 0, 0 | 750 | 60 | 82 | NG |
| Sample 4.2 | 300 | 20 | 90 | 0 | 0, 0 | 1180 | 35 | 42 | NG |
| Sample 4.3 | 300 | 25 | 90 | 0 | 0, 0 | 1250 | 28 | 33 | NG |
| Sample 4.4 | 300 | 30 | 90 | 0 | 0, 0 | 1320 | 25 | 25 | NG |
| Sample 4.5 Z | 300 | 35 | 90 | 0 | 0, 0 | 1350 | 25 | 16 | GOOD |
| Sample 4.6 | 300 | 35 | 90 | 25 | 0, 0 | 1440 | 26 | 18 | GOOD |
| Sample 4.7 | 300 | 35 | 90 | 45 | 0, 0 | 1125 | 45 | 26 | NG |
| Sample 4.8 | 300 | 35 | 90 | 60 | 0, 0 | 1021 | 32 | 32 | NG |
| Sample 4.9 | 300 | 35 | 90 | 75 | 0, 0 | 800 | 40 | 76 | NG |
| Sample 4.10 XY | 300 | 35 | — | 90 | 0, 0 | 720 | 75 | 121 | NG |
| Sample 4.11 | 300 | 35 | 135 | 0 | 0, 0 | 920 | 40 | 62 | NG |
| Sample 4.12 Origin Position Change | 300 | 35 | 270 | 0 | 0, 0 | 600 | 52 | 128 | NG |
| Sample 4.13 | 300 | 35 | 90 | 0 | 0, 180 | 1520 | 20 | 13 | GOOD |
| Sample 4.14 | 300 | 35 | 90 | 0 | 0, 330 | 1750 | 26 | 12 | GOOD |
| Sample 4.15 | 300 | 35 | 135 | 0 | −250, 250 | 1815 | 20 | 6 | BETTER |
| Sample 4.16 | 300 | 35 | 180 | 0 | −330, 0 | 1650 | 26 | 8 | BETTER |

Criteria were defined as follows. Samples whose polishing rate was slower than 1200 nm/min, whose dishing amount exceeded 30 nm, or whose in-plane evenness (3σ) exceeded 20% were determined to be "NG". Samples whose polishing rate was 1200 nm/min or more and less than 1500 nm/min, whose dishing amount was 30 nm or less, and whose in-plane evenness (3σ) exceeded 10% and was 20% or less were determined to be "GOOD". Then, samples whose polishing rate was 1500 nm/min or more, whose dishing amount was 30 nm or less, and whose in-plane evenness (3σ) was 10% or less were determined to be "BETTER".

The flow velocity was measured using an ultrasonic flowmeter. The flow velocity was also adjusted by changing the piping radius of the supply nozzle 530.

In Table 4, the conventional example 4.0 represents the current condition and, as a result of high-speed polishing, the polishing rate was 1100 nm/min and the Cu dishing amount was 80 nm, and the in-plane evenness reached 30%, leading to unstable polishing. The above result shows that, if the rotational speed is increased under the conventional conditions, almost all the polishing liquid will be driven out of the table due to a centrifugal force before reaching the substrate 300 and therefore the polishing rate in the center of a wafer will be slow. Consequently, in-plane evenness will be 30% in 3σ, for example, leading to marked deterioration when compared with results of the rotational speed in the first embodiment. Thus, it is clear that, if the turn table 520 is caused to rotate at high speed under the conventional conditions, the flow rate must further be increased.

The conditions for the samples 4.1 to 4.12 are similar to those of the samples 1.1. to 1.12 in the first embodiment. By using the samples 4.5 and 4.6, the slurry is efficiently supplied to the center of the substrate 300 to improve in-plane evenness (3σ=16%, 18%). Supplying slurry by making the slurry hold a velocity component in the diameter direction of the polishing pad 525, as described above, makes it possible to suppress scratch and film peeling. Here, the samples 4.5 and 4.6 could be used, but the inventors attempted further performance improvement. If almost all the polishing liquid will be driven out of the table due to a centrifugal force before reaching the substrate 300 when the turn table 520 rotates fast, it is desirable to consider the direction of supplying the polishing liquid accordingly. Thus, in the samples 4.13 to 4.16, the polishing liquid was supplied in a direction opposite to the centrifugal force so that the polishing liquid could remain on the polishing pad 525. At this point, by changing the substantial position where the polishing liquid discharged from the supply nozzle 530 under each condition came into contact with the polishing pad 525 and the direction of the supply nozzle 530, effects thereof were checked.

Figure 15:
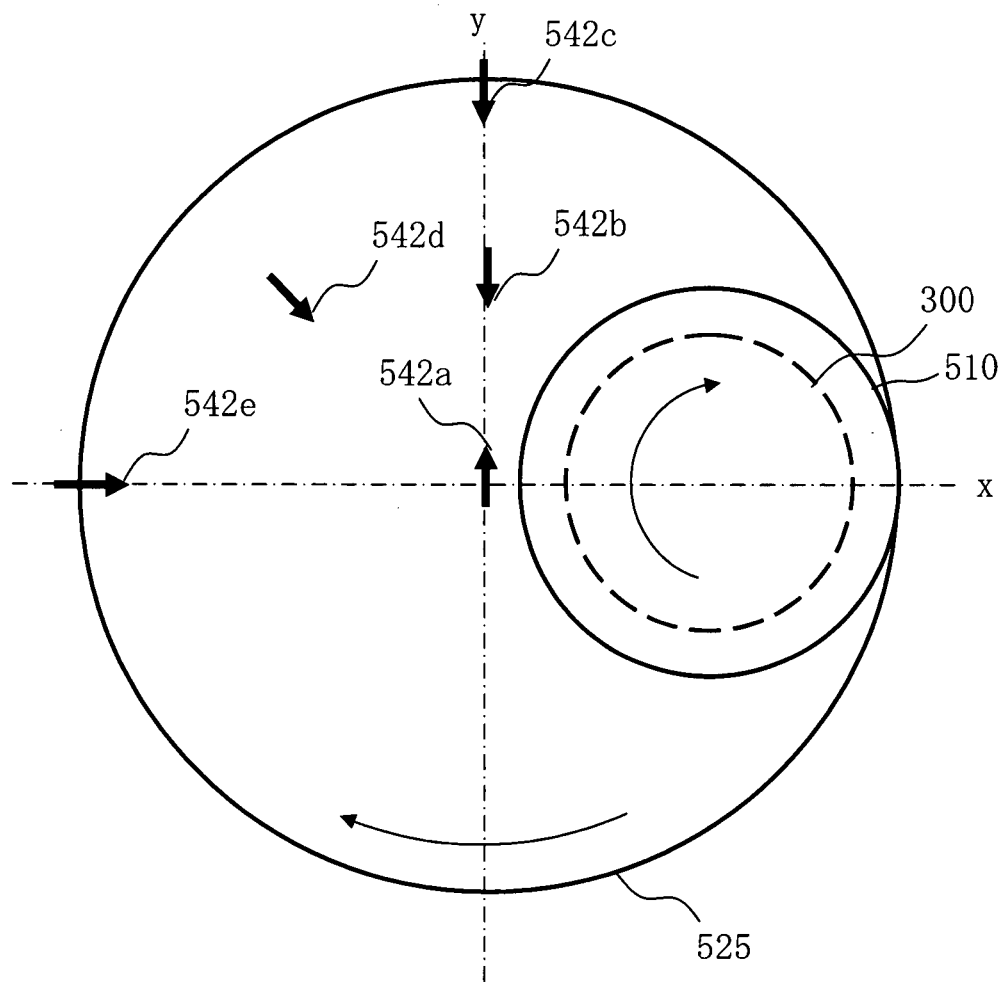
FIG. 15 is a conceptual diagram showing a liquid contact position of a polishing liquid and a direction of a supply nozzle in the third embodiment.

FIG. 15 is a conceptual diagram showing the liquid contact position of a polishing liquid and the direction of a supply nozzle in the third embodiment. In FIG. 15, an arrow 542a shows the liquid contact position and the direction of the supply nozzle 530 in the sample 4.5. That is, the polishing liquid is brought into contact with the polishing pad 525 at a substantial center thereof. An arrow 542b shows the liquid contact position and the direction of the supply nozzle 530 in the sample 4.13. That is, the polishing liquid is brought into contact with the polishing pad 525 at an intermediate position between a substantial outer circumference and a substantial center thereof. An arrow 542c shows the liquid contact position and the direction of the supply nozzle 530 in the sample 4.14. That is, the polishing liquid is brought into contact with the polishing pad 525 at a substantial outer circumference thereof. An arrow 542d shows the liquid contact position and the direction of the supply nozzle 530 in the sample 4.15. That is, the polishing liquid is brought into contact with the polishing pad 525 at an intermediate position between a substantial outer circumference and a substantial center thereof after further changing the angle toward the upstream direction of the rotation direction of the polishing pad 525 with respect to the center of the substrate 300. An arrow 542e shows the liquid contact position and the direction of the supply nozzle 530 in the sample 4.15. That is, the polishing liquid is brought into contact with the polishing pad 525 at a substantial outer circumference thereof after further changing the angle toward the upstream direction of the rotation direction of the polishing pad 525 with respect to the center of the substrate 300. Results of performing Cu-CMP for these positions and directions show that, as shown in Table 4, supplying a polishing liquid from the outer side to the inner side (center side) of the polishing pad 525 so that the polishing liquid holds a velocity component in a direction opposite to the centrifugal force is effective. By shifting a point of supplying the polishing liquid from the center of the table, as described above, improvement of the polishing rate and further improvement of the in-plane evenness can be achieved.

Based on the above results and further, after trials and errors by the inventors, the following ranges were found to be suitable when the turn table 520 was to be made faster. It is suitable if the discharge angle $\phi$ in the xy direction of the chemical fluid 540 to be a polishing liquid discharged from the supply nozzle 530 is set between 45 degrees and 180 degrees toward the upstream direction of the rotation direction of the polishing pad 525 with respect to the center of the substrate 300. Also, it is suitable if the angle $\theta$ in the z direction of the chemical fluid 540 to be a polishing liquid discharged from the supply nozzle 530 is set between 0 degree and 25 degrees with respect to the polishing pad 525 plane. Then, it is suitable if the flow velocity of the supplied chemical fluid 540 to be a polishing liquid is supplied at 0.35 m/sec (35 cm/sec) or more and 1 m/sec (100 cm/sec) or less. Also, it is suitable if the chemical fluid 540 to be a polishing liquid is supplied from the outer side of the polishing pad 525 toward the inner side (center side) of the polishing pad 525. With the above settings, without deteriorating process performance, high-speed rotation can be handled without increasing an amount of supply of the chemical fluid 540 to be a polishing liquid that conventionally requires 0.3 L/min (300 ml/min).

Though, as already described above, treatment with a small amount of CMP slurry and cleaning liquid has been desired in conventional technologies because of high costs of the CMP slurry and cleaning liquid, reduction in flow rate could lead to deterioration of CMP characteristics and degradation in cleaning capability, making implementation thereof difficult. However, as shown in the above embodiments, the amount of slurry used can be reduced without process performance degradation by optimizing the amount of liquid supplied, speed of supply, angle of supply (the angle $\phi$ with respect to a top ring mounted in the carrier 510 and the angle $\theta$ (tilt) with respect to a horizontal direction) and the like. Thus, it is possible to achieve both cost reduction and high performance simultaneously.

Embodiments have been described above with reference to concrete examples. However, the present invention is not limited to these embodiments. As described above, an optimal flow velocity, direction and the like are not uniquely determined and depend on process conditions. Thus, supply conditions may appropriately be determined in such a way that the chemical fluid 540 has a velocity component in a plane direction of the polishing pad 525 fitting to each of the various process conditions. If, for example, a liquid is supplied from the outer side toward the inner side or from the inner side toward the outer side of the polishing pad 525, embodiments are not limited to those in which the direction of the supply nozzle 530 viewed from above is completely matched to the diameter direction of the polishing pad 525. Any direction may do in which the supplied chemical fluid 540 preferably has a velocity component in the diameter direction of the polishing liquid 525 and more preferably has a diameter direction speed component of the chemical fluid 540 greater than a circumferential direction speed component. Also, the low-k film 220 was used as a dielectric film of the Cu wiring layer, but embodiments are not limited to this and, for example, an $SiO_2$ film or the like may be used.

The thickness of interlayer dielectric films, size of openings, forms, number and the like can be used by making appropriate choices of those required for integrated circuits and various semiconductor devices.

In addition, all polishing methods and methods of manufacturing a semiconductor device having components of the present invention and whose design can be modified by those skilled in the art are included in the scope of the present invention.

Techniques usually used in the semiconductor industry such as a photolithography step and cleaning before and after processes are omitted for simplification of description, but it goes without saying that such techniques are included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method, comprising:
   causing a polishing pad arranged on a turn table to rotate together with the turn table; and
   polishing a surface of a substrate by using the rotating polishing pad while supplying a chemical fluid to a surface of the polishing pad on a fore side of the substrate from an oblique direction with respect to the surface of the polishing pad,
   wherein the chemical fluid is supplied from a substantial center of the polishing pad toward an outer side of the polishing pad and from a nozzle inclined such that an angle between the surface of the polishing pad and a direction of the nozzle is 60 degrees or less such that the chemical fluid contacts with the surface of the polishing pad from a diagonal direction, a nozzle opening being arranged at a substantial center position of the polishing pad and directed toward the outer side of the polishing pad and being arranged toward the fore side of the substrate and an upstream direction of a rotation direction of the polishing pad with respect to the substrate.

2. The polishing method according to claim 1, wherein the chemical fluid is supplied so that the chemical fluid comes into contact with a center side of the polishing pad rather than an end of the substrate.

3. The polishing method according to claim 1, wherein a conductive material film is formed on the substrate, and the substrate on which the conductive material film is formed is used to polish the conductive material film.

4. The polishing method according to claim 1, wherein a conductive material film is formed on the substrate, the conductive material film is polished, and the substrate after the conductive material film has been polished is used to polish the conductive material film for cleaning.

5. The polishing method according to claim 1, wherein a silicon oxide film is formed on the substrate, and the substrate on which the silicon oxide film is formed is used to polish the silicon oxide film.

6. The polishing method according to claim 1, wherein the chemical fluid contacts with the surface of the polishing pad at an angle of 60 degrees or less.

7. A polishing method, comprising:
   causing a polishing pad arranged on a turn table to rotate together with the turn table; and
   polishing a surface of a substrate by using the rotating polishing pad while supplying a chemical fluid to a surface of the polishing pad on a fore side of the substrate from an oblique direction with respect to the surface of the polishing pad,
   wherein the chemical fluid is supplied from an outer side of the polishing pad toward a center of the polishing pad and from a nozzle inclined such that an angle between the surface of the polishing pad and a direction of the nozzle is 60 degrees or less such that the chemical fluid contacts with the surface of the polishing pad from a diagonal direction, a nozzle opening being arranged at an outer side position of the polishing pad and directed toward a center of the polishing pad and toward the fore side of the substrate.

8. The polishing method according to claim 7, wherein the chemical fluid is supplied so that the chemical fluid comes into contact with a substantial outer circumference of the polishing pad.

9. The polishing method according to claim 7, wherein the chemical fluid is supplied so that the chemical fluid comes into contact with a substantial intermediate position between the substantial center and a substantial outer circumference of the polishing pad.

10. A method for fabricating a semiconductor device, comprising:
    forming a film on a surface of a substrate; and
    polishing the film by using a rotating polishing pad while supplying a chemical fluid to a surface of the polishing pad on a fore side of the substrate from an oblique direction with respect to the surface of the polishing pad,
    wherein the chemical fluid is supplied from a substantial center of the polishing pad toward an outer side of the polishing pad and from a nozzle inclined such that an angle between the surface of the polishing pad and a direction of the nozzle is 60 degrees or less such that the chemical fluid contacts with the surface of the polishing pad from a diagonal direction, a nozzle opening being arranged at a substantial center position of the polishing pad and directed toward the outer side of the polishing pad and being arranged toward the fore side of the substrate and an upstream direction of a rotation direction of the polishing pad with respect to the substrate.

11. The method according to claim 10, wherein the chemical fluid is supplied so that the chemical fluid comes into contact with a center side of the polishing pad rather than an end of the substrate.

12. The method according to claim 10, further comprising:
    after the film has been polished, re-polishing the film for cleaning while supplying a cleaning liquid to the surface of the polishing pad on the fore side of the substrate from the oblique direction with respect to the surface of the polishing pad.

13. The method according to claim 10, wherein a conductive material film is used as the film.

14. The method according to claim 10, wherein a silicon oxide film is used as the film.

15. A method for fabricating a semiconductor device, comprising:
    forming a film on a surface of a substrate; and
    polishing the film by using a rotating polishing pad while supplying a chemical fluid to a surface of the polishing pad on a fore side of the substrate from an oblique direction with respect to the surface of the polishing pad,
    wherein the chemical fluid is supplied from an outer side of the polishing pad toward a center of the polishing pad and from a nozzle inclined such that an angle between the surface of the polishing pad and a direction of the nozzle is 60 degrees or less such that the chemical fluid contacts with the surface of the polishing pad from a diagonal direction, a nozzle opening being arranged at an outer side position of the polishing pad and directed toward a center of the polishing pad and toward the fore side of the substrate.

16. The method according to claim 15, wherein the chemical fluid is supplied so that the chemical fluid comes into contact with a substantial outer circumference of the polishing pad.

17. The method according to claim 15, wherein the chemical fluid is supplied so that the chemical fluid comes into contact with a substantial intermediate position between the substantial center and a substantial outer circumference of the polishing pad.

* * * * *